US008736341B2

(12) United States Patent
Mizutani

(10) Patent No.: US 8,736,341 B2
(45) Date of Patent: May 27, 2014

(54) SEMICONDUCTOR APPARATUS HAVING MULTIPLE CHIPS MOUNTED THEREON

(71) Applicant: Fujitsu Semiconductor Limited, Kanagawa (JP)

(72) Inventor: Kouji Mizutani, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/693,862

(22) Filed: Dec. 4, 2012

(65) Prior Publication Data
US 2013/0176063 A1 Jul. 11, 2013

(30) Foreign Application Priority Data

Jan. 10, 2012 (JP) ................................. 2012-002207

(51) Int. Cl.
*H03K 3/00* (2006.01)
(52) U.S. Cl.
USPC .......................................................... 327/295
(58) Field of Classification Search
USPC .................................. 327/291–293, 295–297
See application file for complete search history.

(56) References Cited

U.S. PATENT DOCUMENTS

| 7,849,348 | B1* | 12/2010 | Sidiropoulos et al. ........ 713/500 |
| 7,994,828 | B2* | 8/2011 | Kao et al. ...................... 327/115 |
| 2010/0182046 | A1 | 7/2010 | Otsuga et al. |
| 2011/0093735 | A1 | 4/2011 | Yoko et al. |

FOREIGN PATENT DOCUMENTS

| JP | 2010-171092 A | 8/2010 |
| JP | 2011-081731 A | 4/2011 |

* cited by examiner

*Primary Examiner* — An Luu
(74) *Attorney, Agent, or Firm* — Arent Fox LLP

(57) ABSTRACT

A semiconductor apparatus includes a first chip and a second chip mounted on the first chip. The first chip includes a first port that receives an operation clock signal, and a first circuit that operates in synchronization with the operation clock signal. The second chip includes a delay control part that generates a delay control signal indicating a delay amount based on a cycle of a reference clock signal, plural delay circuits that are connected in multiple stages and delay clock signals input to the plural delay control circuits based on the delay control signal and sequentially output the delayed clock signals to a subsequent stage, and a second port that is connected to the first port and receives the operation clock signal based on the delayed clock signals output from the plural delay circuits.

7 Claims, 14 Drawing Sheets

FIG.10

| | | DELAY AMOUNT OF EACH POINT | | | MAXIMUM SKEW | NOTES (CIRCUIT EXAMPLE) |
|---|---|---|---|---|---|---|
| | | P1 | P2 | P3 | | |
| DISTRIBUTE CLOCK WITH DL (DL: LOW PROCESS) | PTV CONDITION 1 | 1.0ns | 1.0ns | 1.0ns | — | 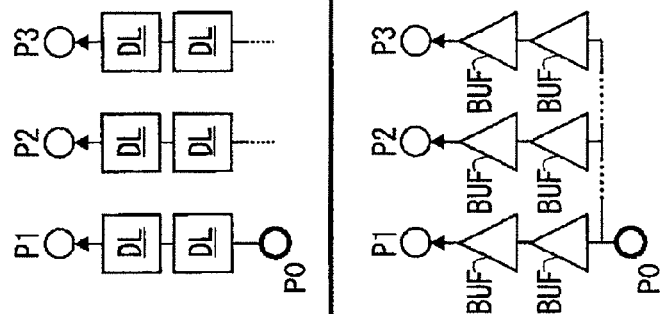 |
| | PTV CONDITION 2 | 0.9ns | 1.0ns | 1.1ns | 200ps | |
| DISTRIBUTE CLOCK WITH DL (DL: ADVANCED PROCESS) | PTV CONDITION 1 | 1.0ns | 1.0ns | 1.0ns | — | |
| | PTV CONDITION 2 | 0.8ns | 1.0ns | 1.4ns | 600ps | |
| COMPARATIVE EXAMPLE 1 (LOW PROCESS) | PTV CONDITION 1 | 1.0ns | 1.0ns | 1.0ns | — | 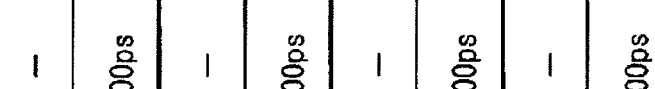 |
| | PTV CONDITION 2 | 1.3ns | 1.5ns | 1.6ns | 300ps | |
| COMPARATIVE EXAMPLE 2 (ADVANCED PROCESS) | PTV CONDITION 1 | 1.0ns | 1.0ns | 1.0ns | — | |
| | PTV CONDITION 2 | 1.8ns | 2.0ns | 2.5ns | 700ps | |

US 8,736,341 B2

SEMICONDUCTOR APPARATUS HAVING MULTIPLE CHIPS MOUNTED THEREON

CROSS-REFERENCE TO RELATED APPLICATIONS

This application is based upon and claims the benefit of priority of the prior Japanese Patent Application No. 2012-002207 filed on Jan. 10, 2012, the entire contents of which are incorporated herein by reference.

FIELD

The embodiments discussed herein are related to a semiconductor apparatus.

BACKGROUND

Owing to the advances of semiconductor manufacturing technology, the structures of semiconductor devices are further miniaturized year by year. Owing to the miniaturization of semiconductor devices, high integration can be achieved in a case of semiconductor devices having the same chip size, and reduction of chip size can be achieved in a case where the integration degree is the same.

Further, technology for mounting multiple chips three-dimensionally (three-dimensional mounting technology) has been drawing attention in recent years. With the three-dimensional mounting technology, multiple layered chips are electrically connected to each other by way of, for example, TSV (Through Silicon Via).
Patent Document 1: Japanese Laid-Open Patent Publication No. 2011-81731
Patent Document 2: Japanese Laid-Open Patent Publication No. 2010-171092

In a case of transferring, for example, clock signals throughout an entire chip, the signals are to be transferred to relatively separated areas. For example, with a semiconductor chip manufactured by using a miniaturizing process, multiple levels of buffers or the like are to be connected in a case of transferring clock signals to a relatively separated area because the absolute amount of driving current of each device of the semiconductor chip is small. Further, with miniaturized transistors, electric property or the like tends to become significantly inconsistent. Therefore, in a case of transferring clock signals throughout an entire chip, the relative timings in which clock signals are transferred deviate from each other.

SUMMARY

According to an aspect of the invention, there is provided a semiconductor apparatus including: a first chip including a first port configured to receive an operation clock signal, and a first circuit configured to operate in synchronization with the operation clock signal; and a second chip mounted on the first chip; wherein the second chip includes a delay control part configured to generate a delay control signal indicating a delay amount based on a cycle of a reference clock signal, plural delay circuits connected in multiple stages and configured to delay clock signals input to the plural delay control circuits based on the delay control signal and sequentially output the delayed clock signals to a subsequent stage, and a second port connected to the first port and configured to receive the operation clock signal based on the delayed clock signals output from the plural delay circuits.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

BRIEF DESCRIPTION OF DRAWINGS

FIG. 10 is a table illustrating an example of clock skew of the semiconductor apparatus illustrated in FIG. 1.

DESCRIPTION OF EMBODIMENTS

Figure 1:
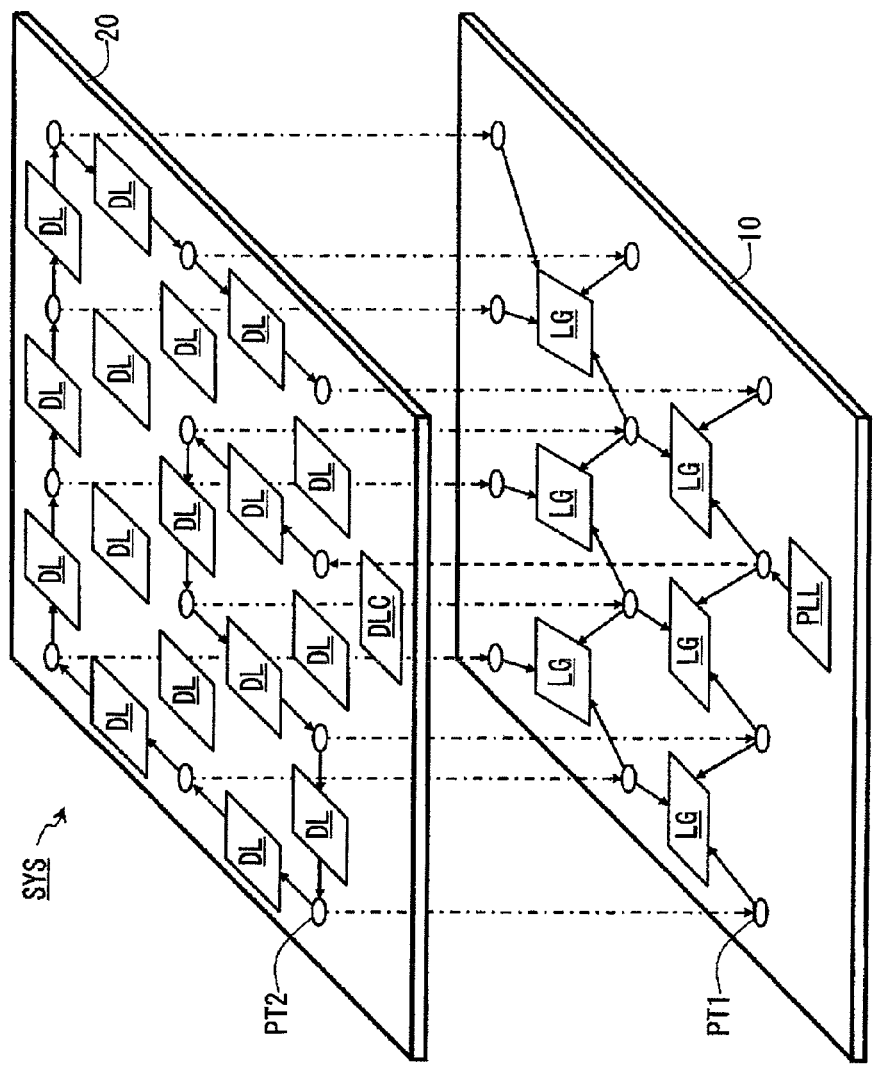
FIG. 1 is a schematic diagram illustrating an example of a semiconductor apparatus according to an embodiment of the present invention.

In the following, embodiments of the present invention will be described with reference to the accompanying drawings.
FIG. 1 is a schematic diagram illustrating an example of a semiconductor apparatus SYS according to an embodiment of the present invention. The arrows illustrated with solid lines in FIG. 1 (hereinafter also referred to as "solid line arrows") indicate the transfer of clock signals. The arrows illustrated with broken lines in FIG. 1 (hereinafter also referred to as "broken line arrows") indicate the transfer of clock signals between a port PT1 and a port PT2. For easier understanding of FIG. 1, external terminals (e.g., pads) other than ports PT1 and PT2 and wirings are omitted from FIG. 1. The semiconductor apparatus SYS includes, for example, a chip (hereinafter also referred to as "first chip") 10 and another chip (hereinafter also referred to as "second chip") 20 mounted on the first chip 10.

The first chip 10 according to the embodiment illustrated in FIG. 1 includes, for example, a phase locked loop PLL, one or more logical circuits LG, and the port PT1. For example, the phase locked loop PLL receives an external clock signal and generates a first clock signal based on the external clock signal. The first clock signal generated by the phase locked loop PLL serves as a basis of an operation clock signal of the logical circuit LG. The first clock signal generated by the phase locked loop PLL is transferred to one of multiple delay circuits DL via the ports PT1, PT2. Alternatively, the phase locked loop PLL may be formed on the second chip 20. The logical circuit LG operates in synchronization with the operation clock signal transferred to the port PT1. The port PT1 receives the operation clock signal of the logic circuit LG from the delay circuit DL of the second chip 2 via the port PT2. Thus, the port PT1 of the first chip 10 is for receiving the operation clock signal and the logic circuit LG of the first chip 10 is for operating in synchronization with the operation clock signal transferred to the port PT1.

Further, the second chip 20 includes, for example, a delay control circuit DLC, a delay circuit DL, and the port PT2. The delay control circuit DLC generates a delay control signal for controlling the amount of delay of the delay circuit DL. The delay circuit DL delays a clock signal input thereto (input clock signal) based on the delay control signal received from the delay control circuit DLC. Then, the delay circuit DL outputs the delayed clock signal to, for example, the port PT2.

The port PT2 includes, for example, a through-electrode that penetrates the chip 20. The through-electrode of the port PT2 is connected to the port PT1. Accordingly, pairs of the ports PT1 and PT2 can be provided. Further, because the through-hole is used to form the port PT2, the port PT1 (to which the port PT2 is connected) can be positioned close to the logic circuit LG.

It is to be noted that the port PT2 may be connected to the port PT1 by using, for example, a bump. In a case where a bump is used to connect the ports P1 and P2, the second chip 20 illustrated in FIG. 1 is flipped upside-down. That is, in a case of connecting the port PT1 and the port PT2, the port PT1 and the like are formed on a surface of the first chip 10 facing the second chip 20, and the port PT2 and the like are formed on a surface of the second chip 20 facing the first chip 10. By connecting the port PT1 and the port PT2 by way of the bump, manufacturing cost of the semiconductor apparatus SYS can be reduced.

In a process of manufacturing the second chip, there is less inconsistency of the devices constituting the second chip 20 compared to those of a process of manufacturing the first chip 10. In the following, a process of manufacturing devices with little inconsistency is hereinafter referred to as a "low process". In general, devices of a chip can be with less inconsistency by using a low process, which belongs to a generation before an advanced process (for example, miniaturized process), than by using the advanced process. For example, the first chip is manufactured by using the advanced process, and the second chip is manufactured by using a process belonging to a generation before the advanced process (low process).

With the second chip 20 manufactured by the low process, devices constituting the second chip 20 can be manufactured with little inconsistency. Therefore, the difference of the changes of properties (characteristics) of the devices in correspondence with, for example, temperature change or power supply change can be reduced. As a result, there is less deviance in the relative timings of clock signals in a case of transferring the clock signals throughout the chip 20. Further, the manufacturing cost of the low process generally is less than the manufacturing cost of the advanced process. Therefore, in this embodiment, the manufacturing cost of the semiconductor apparatus SYS can be reduced by manufacturing the second chip 20 by using the low process.

Further, because the first chip 10 is manufactured by using a miniaturized process, the degree of integration of the first chip 10 can be improved. Because logic circuits LG can use operation clock signals that are transferred from the port PT1 via short distance wirings even in a case where the first chip 10 is manufactured by the miniaturized process, the relative timings of operation clock signals of each of the logic circuits can be prevented from deviating. Thereby, deviance of the relative timings of the clock signals of the semiconductor apparatus SYS can be reduced.

With the semiconductor apparatus SYS of the above-described embodiment of the present invention, the first and the second chips 10, 20 (which are manufactured by using different processes) can be connected by using three-dimensional mounting (e.g., TSV, Through Silicon Via). Thereby, each of the first and the second chips 10, 20 can be manufactured with an optimum process that matches its intended purpose. Thus, the first and the second chips 10, 20 as a whole constitute an optimized semiconductor chip. For example, the logical circuits LG and the like are formed on the first chip 10 for achieving the functions of the semiconductor chip SYS, and the delay control circuits DLC, the delay circuits DL, and the like are formed on the second chip 20 for operating the logical circuits LG.

It is to be noted that the configuration of the semiconductor chip SYS is not limited to the above-described configuration illustrated in FIG. 1. For example, three or more chips may be mounted three-dimensionally on the semiconductor chip SYS.

Figure 2:
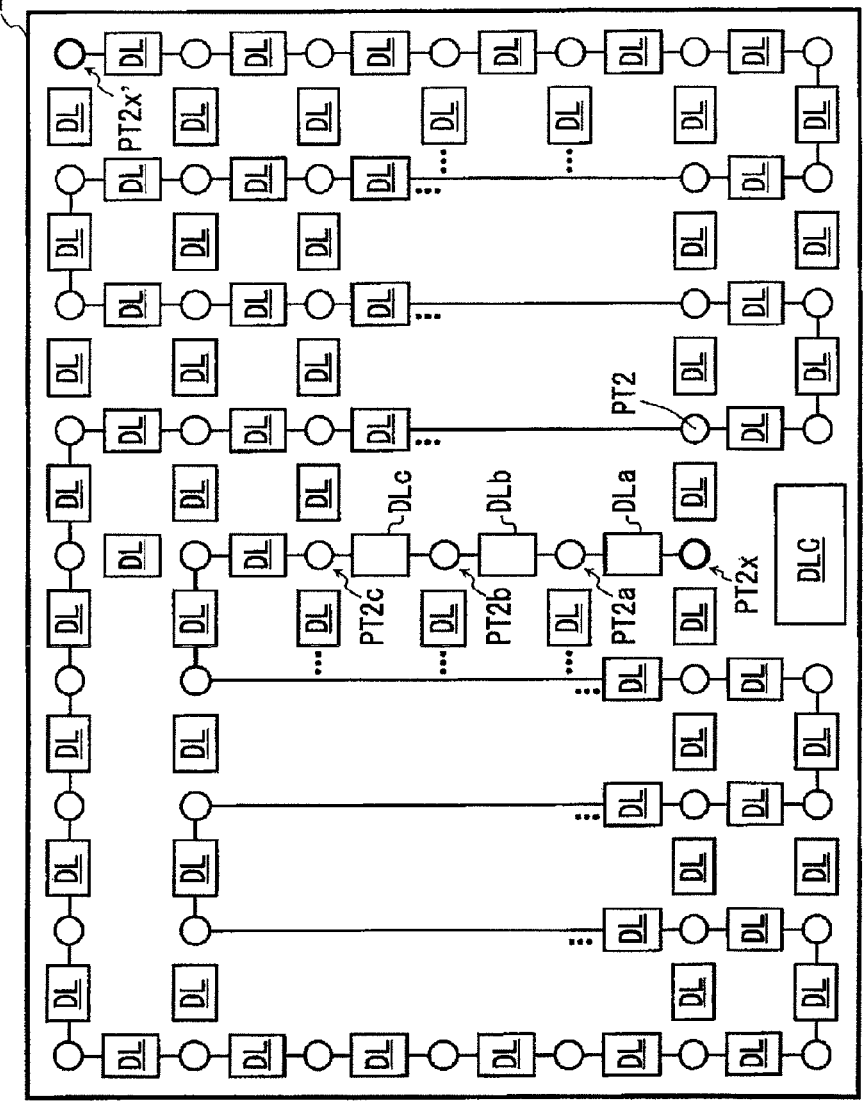
FIG. 2 is a schematic diagram illustrating an example of a second chip of FIG. 1.

FIG. 2 is a schematic diagram illustrating an example of the second chip 20 of FIG. 1. For easier understanding of FIG. 2, wirings other than those used for transferring clock signals are omitted from FIG. 2. Further, external terminals (e.g., pads) other than those connected to the port PT2 are omitted from FIG. 2. In FIG. 2, reference numeral "PT2x" indicates a port corresponding to a starting point of clock signals transferred in the second chip 20, and reference numeral "PT2x'" indicates a port corresponding to an end point of the clock signals transferred in the second chip 20.

The ports PT2, which include, for example, through-electrodes penetrating through the second chip 20, is arranged on the second chip 20 in a mesh-like manner. Further, delay circuits DL are arranged between the ports PT2. For example, a part of multiple delay circuits DL is arranged in a multi-level (multistage) connectable manner (i.e. capable of being connected in multiple levels) in a vertical direction of FIG. 2, and the remaining part of the multiple delay circuits DL are arranged in a multi-level (multistage) connectable manner (i.e. capable of being connected in multiple levels) in a horizontal direction of FIG. 2. Accordingly, the delay circuits DL are arranged in a mesh-like manner in correspondence with the arrangement of the ports PT2

In the example illustrated in FIG. 2, first clock signals (clock signals output from the phase locked loop PLL illustrated in FIG. 1) are transferred to each of the ports PT2 from the port PT2x to the port PT2x' via a unicursal path (clock path). That is, the delay circuits DL are connected in multiple stages from the port PT2x to the port PT2x'. In other words, the clock path according to this embodiment is formed by delay circuits DL connected in multiple stages between the port PT2x and the PT2x'.

It is to be noted that the port PT2 is arranged between the delay circuits DL connected in multiple stages. For example, the port PT2a is arranged between delay circuit DLa and delay circuit Dlb. The port PT2a is connected to the output of the delay circuit DLa and the input of the delay circuit DLb. Further, the port PT2b is arranged between the delay circuit DLb and the delay circuit DLc. The port PT2b is connected to the output of the delay circuit DLb and the input of the delay circuit DLc.

The delay circuit DL is configured to delay a clock signal input thereto (input clock signal) based on a delay control signal received from the delay control circuit DLC. For example, the delay control circuit DLC generates a delay control signal indicating the settings for delaying the input clock signal for a period equivalent to one cycle. Then, the delay control circuit DLC outputs the generated delay control signal to all of the delay circuits DL in the clock path. Alternatively, the delay control circuit DLC may output the delay control signal to all of the delay circuits DL in the second chip 20.

In a case where the delay control signal is set to delay the input clock signal for a period equivalent to one cycle, the delay circuit DL adds a delay equivalent to one cycle to the input clock signal. For example, in a case where the delay circuit DLa receives a first clock signal transferred from the port PT2x (i.e. input clock signal), the delay circuit DLa delays the input clock signal for a period equivalent to one cycle and outputs the delayed clock signal from the port PT2a. Then, in a case where the delay circuit DLb receives the delayed clock signal transferred from the port PT2a (i.e. input clock signal (first clock signal delayed for a period equivalent to one cycle)), the delay circuit DLb further delays the input clock signal for a period equivalent to one cycle and outputs the delayed clock signal to the port PT2b.

In a case where the delay circuit DLc receives the delayed clock signal from the PT2b (i.e. input clock signal (first clock signal delayed for a period equivalent to two cycles)), the delay circuit DLc further delays the input clock signal for a period equivalent to one cycle and outputs the delayed clock signal to the port PT2c. Likewise, the first clock signal is delayed for a period equivalent to one cycle whenever the first clock signal passes (i.e. input to and output from) a delay circuit DL and is transferred to the next delay circuit DL until the first clock signal reaches the port PT2x'. Accordingly, the delay circuits DL being connected in multiple stages delays input clock signals and sequentially transfers the delayed clock signals to the next port PT based on the delay control signal. Thereby, the phases of the clock signals transferred to each of the ports PT2 are substantially the same.

The wirings of the delay circuits DL may be formed only in areas corresponding to the clock path. Alternatively, the wirings of the delay circuits DL may be formed between the delay circuits Dl regardless of the configuration of the clock path. Further, in such case where the wirings of the delay circuits DL are formed regardless of the configuration of the clock path, the outputs of the delay circuits other than those provided on the clock path are set to, for example, a high impedance state. That is, the delay circuits DL other than those provided on the clock path are electrically connected, so that the outputs of the delay circuits DL do not collide with each other. In other words, the delay circuits DL other than those provided on the clock path are electrically connected with each other, so that the clock signals output from multiple delay circuits DL are prevented from being transferred to a single port PT2.

With the above-described embodiment, the clock path can easily be changed because the delay paths DL are arranged in a mesh-like manner. Thereby, the second chip 20 can be applied to multiple first chips 10 having functions different from each other. That is, with the above-described embodiment, the second chip 20 can be used for general purposes. For example, with the above-described embodiment, manufacturing steps prior to the step of forming the wiring layer can be commonly applied to multiple chips 20 having clock paths that are different from each other. As a result, manufacturing cost of the second chip 20 can be reduced.

It is to be noted that the configuration of the second chip 20 is not limited to the configuration described above. For example, the delay circuits Dl other than those provided on the clock path may be omitted from the second chip 20. Further, the second chip 20 may include a decoder, so that the outputs of the delay circuits DL other than those provided on the clock path can be set having a high impedance. In a case where the decoder is included in the second chip 20, the second chip 20 can be used for more general purposes (improved usability) because the clock path can be set with the decoder. For example, the second chip can be easily applied to multiple first chips 10 having different functions by changing the settings of the clock path with the decoder.

Further, the clock path is not limited to a unicursal path. As long as the output of a delay circuit DL can be prevented from colliding with the output of another delay circuit DL, the inputs of multiple delay circuits DL may be electrically connected to the output of a single delay circuit DL. In a case where the inputs of multiple delay circuits DL are connected to the output of a single delay circuit DL, the designing of the clock path is facilitated because the number of paths that can be selected when setting the clock path is increased (increased number of choices of paths).

For example, even if the wirings between the delay circuits DL are formed only in areas corresponding to the clock path, the load of each of the delay circuits DL provided on the clock path is substantially the same in a case where the clock path has a unicursal configuration. That is, the differences of the input impedance or the output impedance among the delay circuits DL can be reduced. As a result, deviance of the relative timing of clock signals can be reduced in a case of transferring the clock signals throughout the entire second chip 20.

Figure 3:
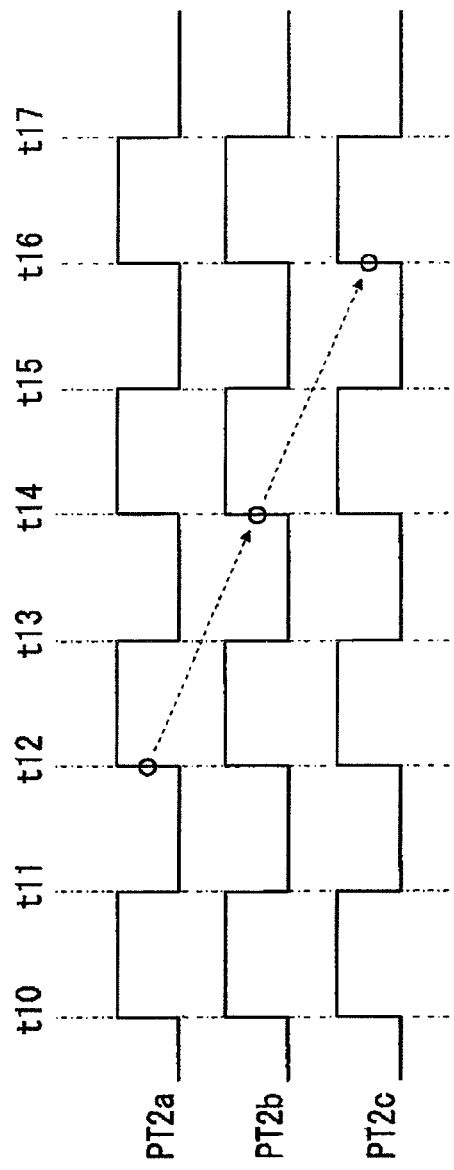
FIG. 3 is a schematic diagram illustrating an example of clock signals transferred to ports of the second chip of FIG. 2.

FIG. 3 illustrates an example of clock signals transferred to the ports PT2a, PT2b, and PT2c of the second chip 20 of FIG. 2. In other words, FIG. 3 illustrates clock signals output from the delay circuits DLa, DLb, and DLc of FIG. 2. In FIG. 3, each delay circuit DL delays an input clock signal for a period equivalent to one cycle.

For example, the delay circuit DLa receives a first clock signal (input clock signal) transferred from the port PT2x of FIG. 2. Then, the delay circuit DLa delays the input clock signal for a period equivalent to one cycle and outputs the delayed clock signal to the port PT2b.

For example, in a case where the clock signal output from the port PT2a reaches the port PT2b, the rising edge of the clock signal output from the port PT2a at time t12 (indicated with a circle of port PT2a in FIG. 3) is delayed for a period equivalent to one cycle from time t12 to time t14. Thus, the rising edge of the clock signal of the port PT2b at time t14 (indicated with a circle of port PT2b in FIG. 3) corresponds to a timing in which the rising edge of the clock signal of the port PT2a at time t12 is delayed for a period equivalent to one cycle.

For example, the delay circuit DLc receives the clock signal (input clock signal) transferred from the port PT2b (output of the delay circuit DLb). Then, the delay circuit DLb delays the input clock signal for a period equivalent to one cycle and outputs the delayed clock signal to the port PT2c. For example, in a case where the clock signal output from the port PT2b reaches the port PT2c, the rising edge of the clock signal output from the port PT2b at time t14 (indicated with a circle of port PT2b in FIG. 3) is delayed for a period equivalent to one cycle from time t14 to time t16.

Thus, the rising edge of the clock signal of the port PT2c at time t16 (indicated with a circle of port PT2c in FIG. 3) corresponds to a timing in which the rising edge of the clock signal of the port PT2*b* at time t14 is delayed for a period equivalent to one cycle. In other words, the rising edge of the clock signal of the port PT2*c* at time t16 (indicated with a circle of port PT2*c* in FIG. 3) corresponds to a timing in which the rising edge of the clock signal of the port PT2*a* at time t12 is delayed for a period equivalent to two cycles.

Accordingly, the amount of delay of the clock signal transferred to each port PT2 is added (incremented) in units of one cycle. Therefore, the phases of the clock signals transferred to each of the ports PT2 are substantially the same. Thus, with the above-described embodiment, deviance of the relative phases of clock signals can be reduced. In other words, with the above-described embodiment, deviance of the relative timings of clock signals can be reduced.

Figure 4:
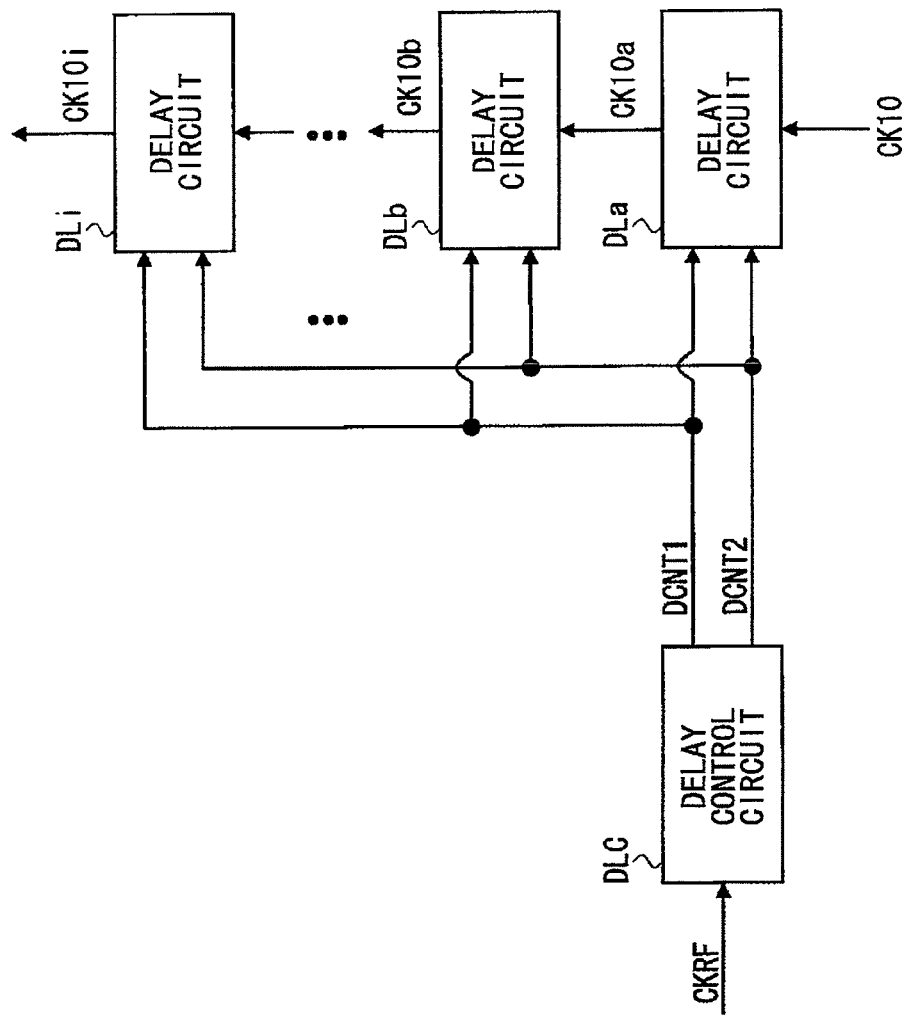
FIG. 4 is a schematic diagram illustrating the delay control circuit and the delay circuit of FIG. 2.

FIG. 4 is a schematic diagram illustrating the delay control circuit DLC and the delay circuits DL of FIG. 2. In FIG. 4, the delay circuits DL other than the delay circuits DLa, DLb, and Dli are omitted from FIG. 4. The group of circuits including the delay control circuit DLC and the delay circuits DL has a function of a DLL (Delay Locked Loop) in which a predetermined delay amount is added to the clock signal input to the delay circuit DL. The cycle of a reference clock CKRF serves as the criterion of the predetermined delay amount.

For example, the delay control circuit DLC receives the reference clock signal CKRF and generates a delay control signal DCNT1 and a delay control signal DCNT2. The reference clock signal CKRF may be the first clock generated by the PLL of FIG. 1 (i.e. first clock transferred from the port PT2*x* of FIG. 2). Alternatively, the reference clock signal CKRF may be a clock signal generated from another clock source other than the PLL of FIG. 1. In other words, the reference clock signal CKRF received by the delay control circuit DLC may be the same clock signal as the clock signal CK 10 (first clock) input to the first delay circuit DLa of the delay circuits DL connected in multi-stages, or a clock signal different from the clock signal CK 10.

Further, the delay control circuit DLC outputs the delay control signals DCNT1, DCNT2 to all of the delay circuits DL (DLa, DLb, . . . , DLi) provided on the clock path. Alternatively, the delay control circuit DLC may output the delay control signals DCNT1, DCNT2 to all of the delay circuits DL in the second chip 20. The delay control signal DCNT1 may be a signal indicating, for example, the delay amount equivalent to one cycle of the reference clock CLRF. The delay control signal DCNT2 may be a signal indicating, for example, whether the delay control signal DCNT1 is valid. For example, in a case where the delay control signal DCNT2 is asserted, the delay circuit DL interprets that the delay control signal DCNT1 is a valid signal.

Each of the delay circuits DLa, DLb, DLi receives the delay control signals DCNT1, DCNT2 from the delay control circuit DLC. Then, the delay circuits DLa, DLb, DLi delay corresponding input clock signals based on the delay control signals DCNT1 and DCNT2, respectively. During a period where the delay control signal DCNT2 is asserted, the delay circuits DLa, DLb, DLi may, for example, add a delay amount to the input clock signals in accordance with the delay control signal DCNT1. Further, during a period where the delay control signal DCNT2 is negated (de-asserted), the delay circuits DLa, DLb, DLi may, for example, refrain from changing the settings of the delay amount.

The clock signal CK10 input to the delay circuit DLa is, for example, a first clock signal transferred to the port PT2*x* of FIG. 2. Further, the clock signals input to the delay circuits DLb, . . . , Dli are clock signals output from a preceding delay circuit DL. For example, the clock signal CK10*a* input to the delay circuit DLb is a clock signal CK10*a* output from the delay circuit DLa which precedes the delay circuit DLb.

Figure 5:
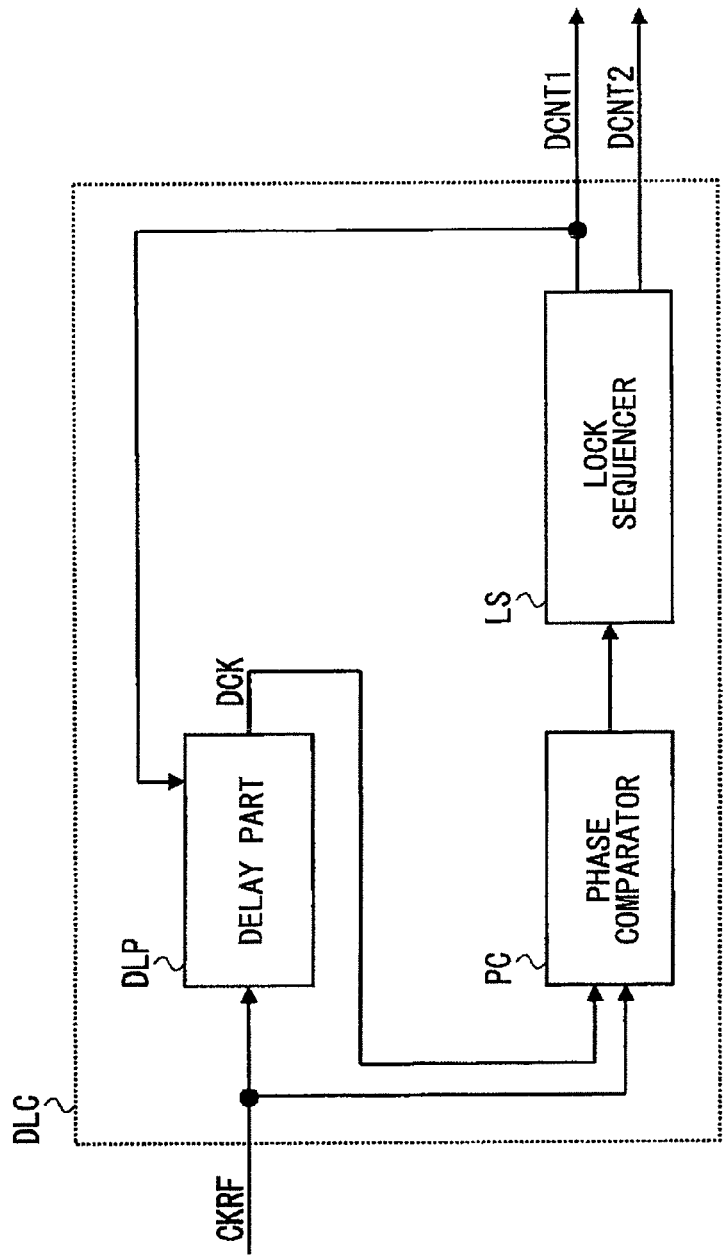
FIG. 5 is a schematic diagram illustrating an example of the delay control circuit of FIG. 4.

FIG. 5 illustrates an example of the delay control circuit DLC of FIG. 4. The delay control circuit DLC functions as, for example, a DLL which detects the delay amount for delaying the reference clock signal CKRF for a period equivalent to one cycle. For example, the delay control circuit DLC includes a delay part DLP, a phase comparator PC, and a lock sequencer LS.

The delay part DLP receives the reference clock signal CKRF and the delay control signal DCNT1 and delays the reference clock signal CKRF based on the delay control signal DCNT1. Then, the delay part DLP outputs a delay clock signal DCK (i.e. clock signal obtained by delaying the reference clock signal CKRF) to the phase comparator PC. The phase comparator PC receives the reference clock signal CKRF and the delay clock signal DCK and compares the phase of the reference clock signal CKRF and the phase of the delay clock signal DCK. Then, the phase comparator PC outputs the results of the comparison between the phase of the reference clock signal CKRF and the phase of the delay clock signal DCK to the lock sequencer LS.

The lock sequencer LS generates the delay control signals DCNT1, DCNT2 based on the comparison results between the phase of the reference clock signal CKRF and the phase of the delay clock signal DCK. For example, the lock sequencer LS sets the delay amount for the next step according to the phase comparison results and outputs the delay control signal DCNT1 (which indicates the set delay amount) to the delay part DLP and the delay circuit DL.

Further, the lock sequencer LS outputs the delay control DCNT2 (which serves to indicate the status of the sequence of the delay control circuit DLC) to the delay circuit DL. For example, in a case where the sequence of the delay control circuit DLC is in a locked state, the delay control signal DCNT2 is asserted. That is, the delay circuit DL interprets the delay control signal DCNT1 as a valid signal in a case where the sequence of the delay control circuit DLC is in a locked state.

In this embodiment, the sequence of the delay control circuit DLC becomes locked (locked state) in a case where the difference between the phase of the reference clock CKRF and the phase of the delay clock DCK is within a predetermined permissible range. Accordingly, in a case where the result of the comparison between the phase of the reference clock CKRF and the phase of the delay clock DCK is within the predetermined permissible range, the lock sequencer LS asserts the delay control signal DCNT2. In a case where the phase of the reference clock CKRF and the phase of the delay clock DCK is beyond the predetermined permissible range, the lock sequencer LS negates (de-asserts) the delay control signal DCNT2 because the sequence of the delay control circuit DLC is not in a locked state.

Accordingly, the delay control circuit DLC generates the delay clock signal DCK (obtained by delaying the reference clock signal CKRF for a period equivalent to, for example, one cycle) and generates the delay control signal DCNT1 for setting the delay amount of the delay clock signal DCK to a predetermined amount.

Figure 6:
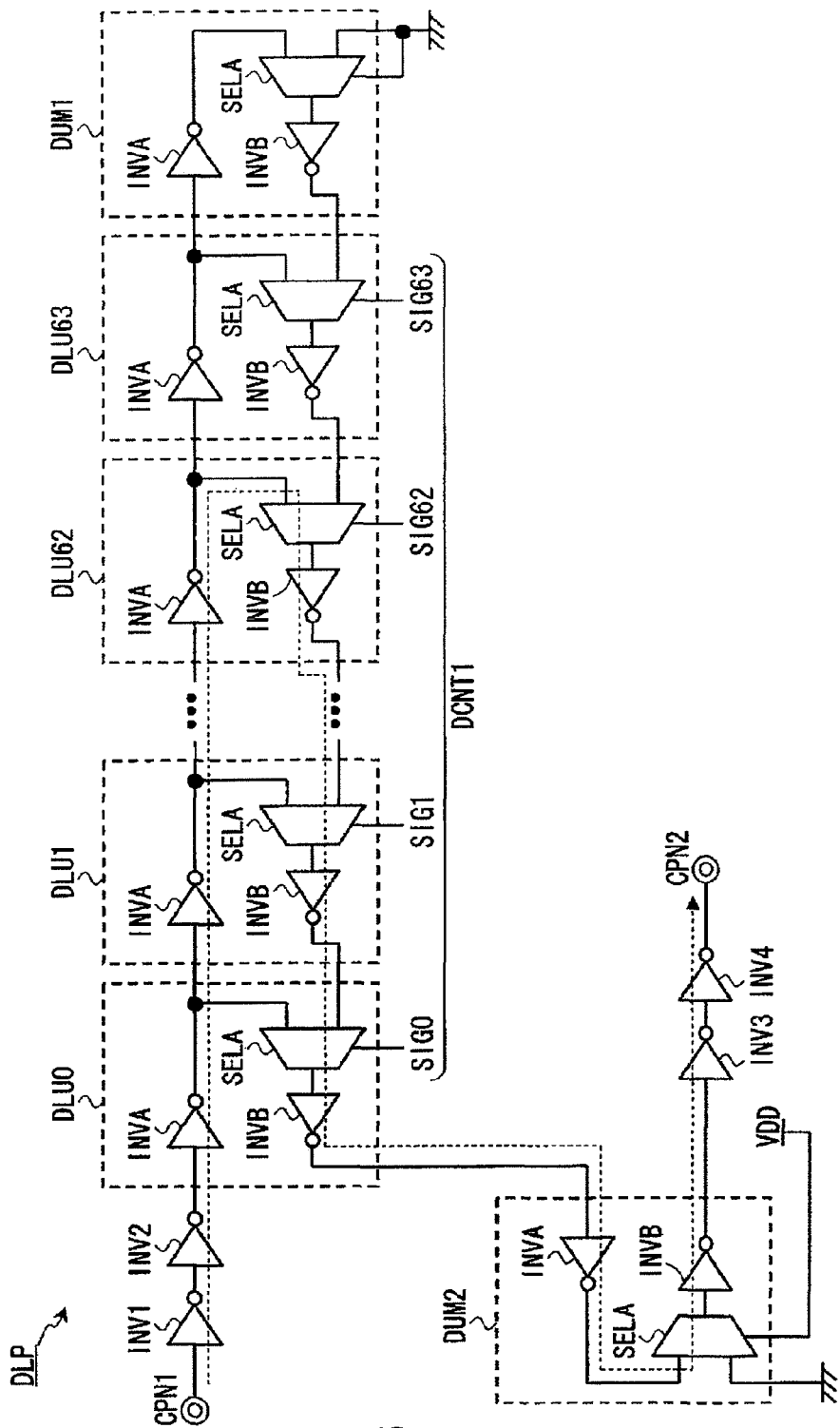
FIG. 6 illustrates an example of the delay part of FIG. 5.

FIG. 6 illustrates an example of the delay part DLP of FIG. 5. The arrow illustrated with broken lines in FIG. 6 (hereinafter also referred to as "broken line arrow") indicates an example of a delay path. The inverters INV (INV1, INV2, INV3, INV4, INVA, INVB) illustrated in FIG. 6 are inverting circuits that invert input signals and output the inverted signals. The control signals SIG (SIG0 to SIG63) correspond to the delay control signal DCNT1.

The delay part DLP according to an embodiment of the present invention includes, for example, the inverters INV1, INV2, INV3, INV4, and 64 delay circuit units DLU (DLU0 to DLU63), and two delay circuit units DLM (DUM1, DUM2). It is to be noted that the number of the first delay circuit units DLU is not limited to 64. As described below, although the configurations of the delay circuit units DUM1, DUM2 are the same as those of the delay circuit units DLU (DLU0 to DLU63), the delay circuit units DUM1, DUM2 are used to provide functions different from those of the delay circuit units DLU (DLU0 to DLU63).

The inverters INV1, INV2 are connected in series in-between a terminal CPN1 and the input of the inverter INVA of the delay circuit unit DLU0. The inverters INV1, INV2 are for improving the characteristics (properties) of the clock signals transferred to the delay circuit unit DLU0. For example, the reference clock CKRF of FIG. 5 is input to the terminal CPN1.

The delay circuit units DLU (DLU0-DLU63) are connected in multiple stages (multi-stage connection). In the following, a delay circuit unit having a reference numeral that is one value less than a reference numeral of a target delay circuit unit is hereinafter also referred to as "preceding delay circuit unit" (i.e. a delay circuit unit connected to the front (input) of the target delay circuit unit). Likewise, a delay circuit unit having a reference numeral that is one value greater than the reference numeral of the target delay circuit unit is hereinafter also referred to as "succeeding delay circuit unit" (i.e. a delay circuit unit connected to the rear (output) of the target delay circuit unit).

Each delay circuit unit DLU includes an inverter INVA, INVB, and a selector SELA. The inverters INVA of the delay circuit units DLU0-DLU63 are connected in series. For example, the output of the inverter INVA of the delay circuit unit DLU0 is connected to the input of the delay circuit unit DLU1. It is to be noted that the input of the inverter INVA of the delay circuit unit DLU0 is connected to the output of the inverter INV2. Further, the output of the inverter INVA of the delay circuit unit DLU 63 is connected to the input of the inverter INVA of the delay circuit unit DUN1.

One of the two signals input to the selector SELA is output from the selector SELA to the inverter INVB in accordance with a control signal SIG. One of the two inputs of the selector SELA is connected to the output of the inverter INVA and the other of the two inputs of the selector SELA is connected to the output of the inverter INVB of a succeeding delay circuit unit DLU. In the delay circuit unit DLU63, the other of the two inputs of the selector SELA is connected to the output of the inverter INVB of the delay circuit unit DUM1.

For example, in the delay circuit unit DLU63, the selector SELA outputs a signal output from the inverter INVA to the inverter INVB when the control signal SIG63 is a high level, and outputs a signal output from the inverter INVB to the inverter INVB when the control signal SIG63 is a low level. Further, in the delay circuit unit DLU0, the selector SELA outputs a signal output from the inverter INVA to the inverter INVB when the control signal SIG0 is a high level, and outputs a signal output from the INVB of the delay circuit unit DLU1 when the control signal SIG0 is a low level.

The inverter INVB inverts the signal received from the selector SELA and outputs the inverted signal to the selector SELA of a preceding delay circuit unit DLU. For example, the inverter INVB of the delay circuit unit DLU63 inverts a signal received from the selector SELA of the delay circuit unit DLU 63 and outputs the inverted signal to the selector SELA of the delay circuit unit DLU62. It is to be noted that the inverter INVB of the delay circuit unit DLU0 inverts a signal received from the selector SELA of the delay circuit unit DLU0 and outputs the inverted signal to the inverter INVB of the delay circuit unit DUM2.

The delay circuit unit DUM1 functions as a load of the delay circuit unit DLU63. For example, the inverter INVA of the delay circuit unit DUM1 inverts a signal received by the delay circuit unit DUM1 and outputs the inverted signal to one of the two inputs of the selector SELA of the delay circuit unit DUM1. The other one of the two inputs of the selector SELA of the delay circuit unit DUM1 is fixed to, for example, ground potential.

Further, the selector SELA of the delay circuit unit DUM1 is controlled, so that the other one (ground potential) of the two signals input to the selector SELA of the delay circuit unit DUM1 is output to the inverter INVB. For example, the control signal of the selector SELA of the delay circuit unit DUM1 is fixed to the ground voltage. The inverter INVB of the delay circuit unit DUM1 inverts a signal received from the selector SELA of the delay circuit unit DUM1 and outputs the inverted signal to the selector SELA of the delay circuit unit DLU63.

The delay circuit unit DUM2 functions as a load of the delay circuit unit DLU0. For example, the inverter INVA of the delay circuit unit DUM2 inverts a signal received from the inverter INVB of the delay circuit unit DLU0 and outputs the inverted signal to one of the two inputs of the selector SELA of the delay circuit unit DUM2. The other one of the two inputs of the selector SELA of the delay circuit unit DUM2 is fixed to, for example, ground potential.

Further, the selector SELA of the delay circuit unit DUM2 is controlled, so that the one (output of the inverter INVA) of the two signals input to the selector SELA of the delay circuit unit DUM2 is output to the inverter INVB. For example, the control signal of the selector SELA of the delay circuit unit DUM2 is fixed to a voltage VDD. The inverter INVB of the delay circuit unit DUM2 inverts a signal (output of the inverter INVA) received from the selector SELA of the delay circuit unit DUM2 and outputs the inverted signal to the inverter INV3. The inverters INV3, INV4 are connected in series in-between the output of the inverter INVB of the delay circuit unit DUM2 and the terminal CPN2. The inverters INV3, INV4 are for improving the characteristics (properties) of the clock signals output from the delay part DLP. For example, the delay clock DCK of FIG. 5 is output from the terminal CPN2.

The delay amount of the delay part DLP is controlled by selecting the delay path by using the delay control signal DCNT1 (control signals SIG0 to SIG63). For example, in a case of selecting a delay path which returns (folds back) at the delay circuit unit DLU62 (i.e. delay path illustrated with a broken line arrow in FIG. 6), the control signal SIG62 is set to a high level whereas the control signals SIG0 to SIG61, and SIG63 are set to a low level. Alternatively, the control signal SIG63 may also be set to a high level.

In the case where the delay path folds back at the delay circuit unit DLU62, the delay amount of the delay part DLP is set as a delay amount equivalent to the delay amount of 63 of the delay circuit units DLU (inverter INVA, INVB, selector SELA) added with a fixed delay amount. In this embodiment, the fixed delay amount is the sum of the delay amount of the inverters INV1 to INV4 and the delay amount of the delay circuit unit DUM2 (inverters INVA, INVB and selector SELA).

It is to be noted that the configuration of the delay part DLP is not limited to the configuration described above. For example, the inverters INV1 to INV4 and/or the delay circuit units DUM1, DUM2 may be omitted from the delay part DLP.

In the case where the inverters INV1 to INV4 and the delay circuit units DUM1, DUM2 are omitted from the delay part DLP, the fixed delay amount is "0". Therefore, the delay amount of the delay part DLP is set to a delay amount equivalent to the total delay amount of the delay circuit units DLU selected by the delay control signal DCNT1. In addition, the delay part DLP may include, for example, a delay line having multiple delay elements connected in series and a selector for receiving output from each of the delay elements of the delay line. Thereby, the selector selects signals to be output from the delay part DLP in accordance with the output received from each of the delay elements of the delay line.

Figure 7A:
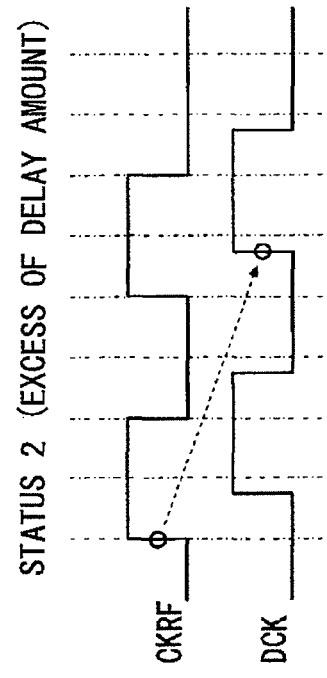
FIGS. 7A-7C are schematic diagrams for describing operations of the delay control circuit of FIG. 5.
Figure 7B:
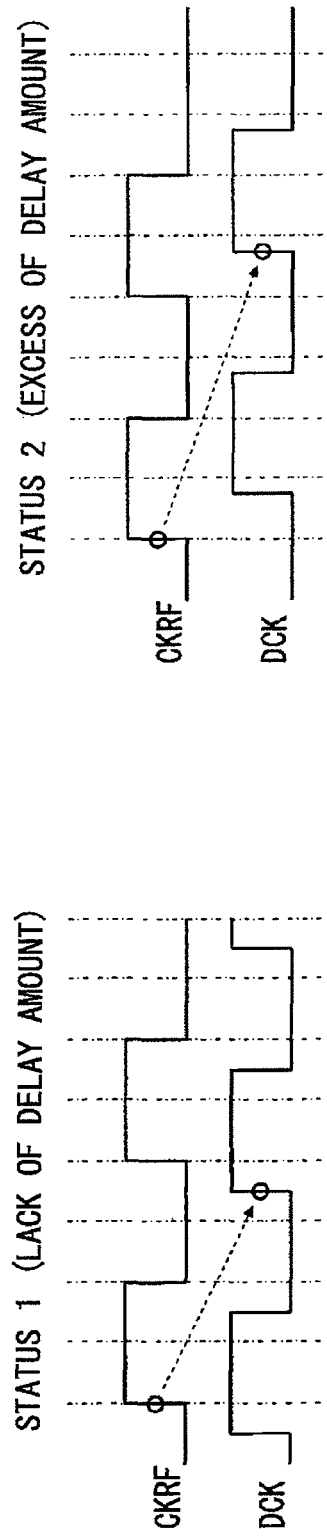
Figure 7C:
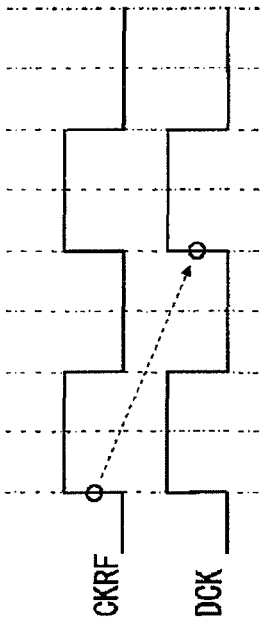

FIGS. 7A-7C are schematic diagrams illustrating examples of operations of the delay control circuit DLC of FIG. 5. Status 1 of FIG. 7A indicates a case where there is a shortage of delay amount of the delay clock DCK. Status 2 of FIG. 7B indicates a case where there is an excess of delay amount (i.e. too much delay amount added). Status 3 of FIG. 7C indicates a case where the sequence of the delay control circuit DLC is in a locked state.

In status 1 of FIG. 7A, the delay clock DCK rises before the reference clock CKRF. Accordingly, the phase comparator PC outputs a signal indicating a comparison result between the delay clock DCK and the reference clock CKRF to the lock sequencer LS. In status 1, the comparison result indicates that the phase of the delay clock DCK is earlier than the phase of the reference clock CKRF. The indication that the phase of the delay clock DCK is earlier than the phase of the reference clock CKRF corresponds to a case where there is a shortage of delay amount of the delay clock DCK.

Therefore, the lock sequencer LS outputs a delay control signal DCNT1 indicating that the delay amount of the next step is to be increased to the delay part DLP. Accordingly, the delay part DLP increases the amount of delay amount to be added in the next step. Thereby, the phase difference between the delay clock DCK and the reference CKRF can be reduced. For example, by reducing the phase difference between the delay clock DCK and the reference CKRF, the phase difference between the delay clock DCK and the reference CKRF falls within a predetermined permissible range, and the sequence of the delay control circuit DLC becomes a locked state (status 3 of FIG. 7C).

In status 2 of FIG. 7B, the delay clock DCK rises after the reference clock CKRF. Accordingly, the phase comparator PC outputs a signal indicating a comparison result between the delay clock DCK and the reference clock CKRF to the lock sequencer LS. In status 2, the comparison result indicates that the phase of the delay clock DCK is later than the phase of the reference clock CKRF. The indication that the phase of the delay clock DCK is later than the phase of the reference clock CKRF corresponds to a case where there is an excess of delay amount of the delay clock DCK.

Therefore, the lock sequencer LS outputs a delay control signal DCNT1 indicating that the delay amount of the next step is to be decreased to the delay part DLP. Accordingly, the delay part DLP decreases the amount of delay amount to be added in the next step. Thereby, the phase difference between the delay clock DCK and the reference CKRF can be reduced. For example, by reducing the phase difference between the delay clock DCK and the reference CKRF, the phase difference between the delay clock DCK and the reference CKRF falls within a predetermined permissible range, and the sequence of the delay control circuit DLC becomes a locked state (status 3 of FIG. 7C).

In status 3 of FIG. 7C, the phase difference between the delay clock DCK and the reference clock CKRF is within the permissible range. Accordingly, the phase comparator PC outputs a signal indicating a comparison result between the delay clock DCK and the reference clock CKRF to the lock sequencer LS. In status 3, the comparison result indicates that the phase difference between the delay clock DCK and the reference clock CKRF is within the permissible range. The comparison result output from the phase comparator PC does not need to directly indicate that the phase difference is within the permissible range. That is, the manner of indicating the comparison result of the phase comparator PC is not to be limited as long as the lock sequencer LS can determine whether the phase difference is within the permissible range based on the comparison result of the phase comparator PC.

In status 3, the sequence of the delay control circuit DLC is in a locked state because the phase difference between the delay clock DCK and the reference clock CKRF is within the permissible range. Therefore, the lock sequencer LS asserts the delay control signal DCNT2. In a case where the phase difference between the delay clock DCK and the reference clock CKRF is not within the permissible range due to, for example, change of temperature or change of power supply, the delay part DLP adjusts or re-adjusts the delay amount to be added until the sequence of the delay control circuit DLC becomes a locked state.

That is, the lock sequence LS generates a delay control signal DCNT1 in conjunction with (cooperating with) the changes of, for example, temperature or power supply. Therefore, the delay control signal DCNT1 is maintained as a signal (delay amount) indicating that the reference clock CKRF is to be delayed for a period equivalent to one cycle even in a case where the properties of the elements (e.g., inverter INV) are changed due to, for example, changes of temperature or power supply.

Figure 8:
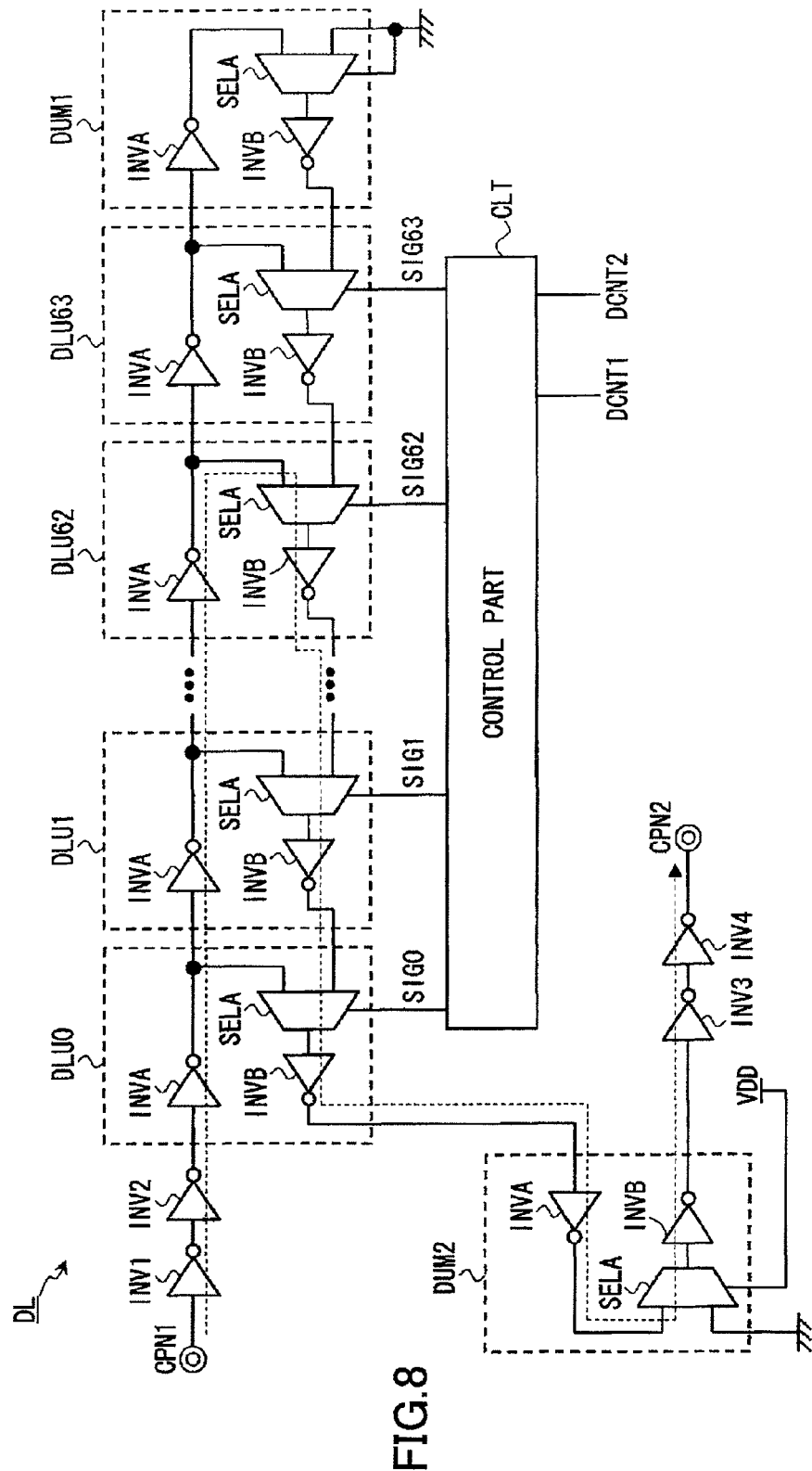
FIG. 8 is a schematic diagram illustrating an example of the delay circuit of FIG. 4.

FIG. 8 illustrates an example of the delay circuit DL of FIG. 4. The arrows illustrated with broken lines in FIG. 8 (hereinafter also referred to as "broken line arrows") indicate an example of a delay path. In the delay circuit DL of FIG. 8, a control part CLT is added to the delay part DLP of FIG. 6. Other than the control part CLT being added to the delay part DLP, the configuration of the delay circuit DL is substantially the same as the configuration of the delay part DLP. For the sake of convenience, the above-described elements of the delay part DLP are indicated by like reference numerals as FIG. 4 and are not further explained.

The control part CLT sets the delay control signal DCNT1 to be valid or invalid (asserts or negates) based on the delay control signal DCNT2. The control part CLT receives, for example, delay control signals DCNT1, DCNT2 and outputs control signals (SIG0 to SIG63). For example, in a case where the delay control signal DCNT2 is negated, the control part CLT does not apply the value of the delay control signal DCNT1 to the control signal SIG (SIG0 to SIG63).

For example, in a case where the delay control signal DCNT2 is asserted, the control part CLT applies the value of the delay control signal DCNT1 to the control signal SIG (SIG0-SIG63). Therefore, in a case where the sequence of the delay control circuit DLC is in a locked state (for example, a case where the delay control signal DCNT2 is asserted), the value of the control signals SIG0-SIG63 is the same as the value of the control signals SIG0-SIG63 of the delay part DLP of FIG. 6.

Accordingly, the configuration of the clock path (delay path) from the terminal CPN1 to the terminal CPN2 is the same for both the delay part DLP and the delay circuit DL. Therefore, the delay amount added in the delay circuit DL is maintained at a delay amount that delays the reference clock signal CKRF for a period equivalent to one cycle even in a case where the properties of the elements (e.g., inverter INV) are changed due to, for example, changes of temperature or power supply.

It is to be noted that the configuration of the delay circuit DL is not limited to the configuration described above. For example, the delay circuit DL need not receive the delay control signal DCNT2. In this case where the delay circuit DL does not receive the delay control signal DCNT2, the configuration of the delay circuit DL is the same as the delay part DLP because the control part CLT is omitted. Further, the inverter INV4 may be an inverting circuit capable being switched on/off (on/off control) in a case where the second chip 20 includes a decoder that sets the outputs of the delay circuits DL other than those on the clock path to a high impedance state. For example, the inverter INV4 sets the outputs of the delay circuits DL to a high impedance state in a case where the inverter INV4 is controlled to be off. In this case, for example, the same inverting circuit as the inverter INV4 of the delay circuit DL is also applied to the inverter INV4 of FIG. 6.

Figure 9:
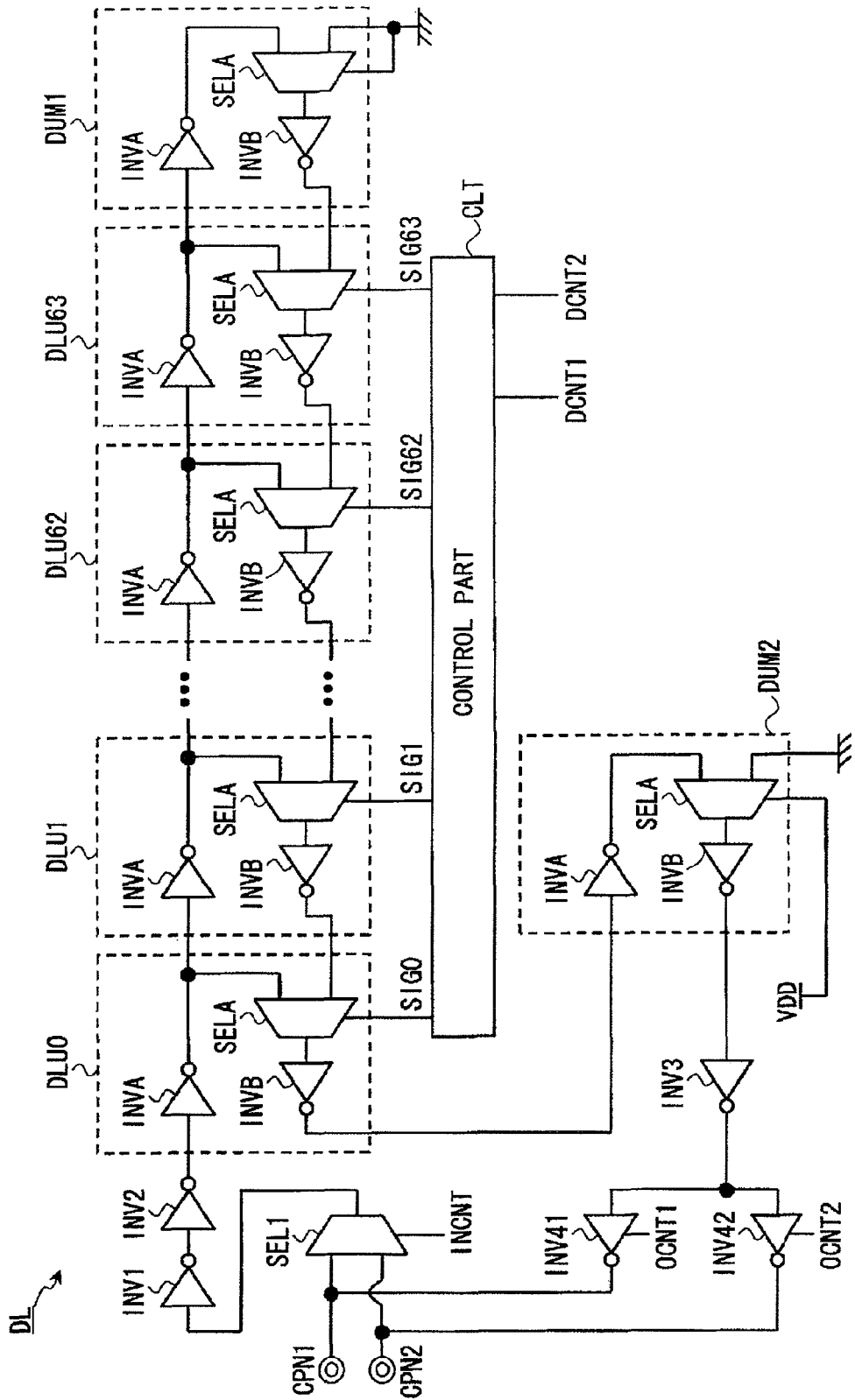
FIG. 9 is a schematic diagram illustrating another example of the delay circuit DL of FIG. 4.

Further, in a case where the configuration of the clock path from the terminal CPN1 to CPN2 of the delay part DLP is different from that of the configuration illustrated in FIG. 6, the configuration of the clock path from the terminal CPN1 to the terminal CPN2 of the delay circuit DL is fabricated to have the same configuration as the delay part DLP. Alternatively, the interfaces (terminals CPN1, CPN2) of the delay circuit DL may be capable of switching between input and output as illustrated in FIG. 9. In this case, the delay part DLP is also fabricated having the same configuration as the delay circuit DL.

FIG. 9 illustrates another example of the delay circuit DL of FIG. 4. In FIG. 9, inverters INV41, INV42 are inverting circuits capable of being switched on/off (on/off control). The delay circuit DL of FIG. 9 has a configuration in which a selector SEL1 is added to the delay circuit DL of FIG. 8, and the inverter INV4 of FIG. 8 is replaced with the inverters INV41, INV42. Other than the aforementioned differences of the delay circuit DL of FIG. 8 and the delay circuit DL of FIG. 9, the configuration of the delay circuit DL of FIG. 9 is substantially the same as the configuration of the delay circuit DL of FIG. 8.

The selector SEL1 outputs one of two signals input to the inverter INV1 in accordance with a control signal INCNT. One of the two inputs of the selector SEL1 is connected to the terminal CPN1 and the other of the two inputs of the selector SEL1 is connected to the terminal CPN2. The input of the inverter INV41 is connected to the output of the inverter INV3, and the output of the inverter INV41 is connected to the terminal CPN1. Further, the inverter INV4 is controlled to switch on/off (on/off control) in accordance with the control signal OCNT1. For example, the output of the inverter INV41 is in a high impedance state in a case where the inverter INV41 is switched off.

The input of the inverter INV42 is connected to the output of the inverter INV3, and the output of the inverter INV42 is connected to the output of the terminal CPN2. Further, the inverter INV42 is controlled to switch on/off (on/off control) in accordance with the control signal OCNT2. For example, the output of the inverter INV42 is in a high impedance state in a case where the inverter INV42 is switched off.

For example, in a case where a signal input from the terminal CPN1 to the selector SEL1 is selected as the output of the selector SEL1, the INV41 is set to an off state whereas the inverter INV42 is set to an on state. For example, in a case where a signal input from the terminal CPN2 to the selector SEL1 is selected as the output of the selector SEL1, the inverter INV41 is set to an on state whereas the INV42 is set to an off state.

In other words, the delay circuit DL delays a clock signal received from one of the terminals CPN1, CPN2 based on the delay control signals DCNT1, DCNT2, and outputs a delayed clock signal from the other one of the terminals CPN1, CPN2. The delay circuit DL illustrated in FIG. 9 has a configuration in which the inputs and outputs of the terminals CPN1, CPN2 can be switched. Therefore, in a case where the second chip 20 includes the delay circuit DL of FIG. 9, the choices of paths to which a clock path is set can be increased. This facilitates designing of clock paths. The levels of the control signals INCNT, OCNT1, OCNT2 can be set by, for example, a decoder. Further, the levels of the control signals INCNT, OCNT1, OCNT2 may be fixed to, for example, the voltage of the power supply or ground potential with the layout during the designing of the clock signal.

FIG. 10 is a table illustrating an example of clock skew of the semiconductor apparatus SYS illustrated in FIG. 1. FIG. 10 illustrates the delay amount of each point P1, P2, P3 in a case of distributing a clock signal having a cycle of 1 ns. The delay amount of each point P1, P2, P3 shown in FIG. 10 correspond to the delay amount in a case where point P0 (see "notes" in the table of FIG. 10) is the reference point, respectively.

The PTV condition is a condition pertaining to a manufacturing process, a temperature, and a voltage of the power supply. For example, the PTV condition 1 indicates the manufacturing process, the temperature, and the voltage of the power supply (power supply voltage) in a case where the delay amount of each of the points P1, P2, P3 is matched with 1 ns. The PTV condition 2 is a condition different from that of the PTV condition 1. For example, with the PTV condition 2, the characteristics of elements differ from those of the PTV condition 1 due to manufacturing inconsistency (inconsistency that is caused in manufacturing). Alternatively, the PTV condition 2 may have different temperature or voltage of power supply from those of the PTV condition 1. In the following, manufacturing inconsistency, change of temperature, and change of power supply voltage may also be collectively referred to as PTV change.

In the semiconductor apparatus SYS which distributes a clock signal by using the delay circuit DL, the delay control signal DCNT1 received by the delay circuit DL maintains data (delay amount) that delays the reference clock signal CKRF for a period equivalent to one cycle of the reference clock signal CKRF. Therefore, with the semiconductor apparatus SYS, the delay amount is maintained to be near the period equivalent to one cycle of the reference clock signal CKRF even with the PTV condition 2. The inconsistencies of the delay amount of the points P1, P2, P3 may occur due to, for example, inconsistency of the characteristics among the delay circuits DL.

With the second chip 20 manufactured by the low process (process in which the amount of manufacturing inconsistency among devices is small), the inconsistency among the delay circuits DL can be reduced compared to a case where the second chip 20 is manufactured by the advanced process.

For example, in a case where the delay circuit DL is manufactured by the low process, the delay amounts of the points P1, P2, and P3 are 0.9 ns, 1.0 ns, and 1.1 ns, respectively. That is, the maximum skew between any of the points P1, P2, P3 is 200 ps. On the other hand, in a case where the delay circuit DL is manufactured by the advanced process, the delay amounts of the points P1, P2, and P3 are 0.8 ns, 1.0 ns, 1.1 ns, respectively. Therefore, the maximum skew between any of the points P1, P2, P3 in this case is 600 ps. Thus, the maximum skew increases compared to the case where the delay circuit DL is manufactured by the low process.

It is to be noted that, even in a case where the delay circuit DL is manufactured by the advanced process, the maximum skew between any of the points P1, P2, P3 is reduced compared to the below-described comparative examples where a clock signal is distributed without the intervening of the delay circuit DL.

In the following comparative examples, a clock signal is distributed without the intervening of the delay circuit DL. For example, a clock network is formed by a chain of buffers or inverters. The comparative example 1 of FIG. 10 illustrates an example of clock skew between any of the points P1, P2, P3 in a case where each element (e.g., buffer BF) of the clock network is manufactured by a low process. The comparative example 2 of FIG. 10 illustrates an example of clock skew between any of the points P1, P2, P3 in a case where each element (e.g., buffer BF) of the clock network is manufactured by an advanced process.

In the comparative examples 1 and 2, the number of buffers or the like is not adjusted in accordance with the PTV condition. Therefore, with the comparative example 2, the delay amount significantly deviates from 1 ns compared to the semiconductor apparatus SYS that distributes a clock signal via the delay circuit DL. With the comparative example 1, maximum skew can be reduced compared to the comparative example 2 because each element (buffer BUF) of the clock network of the comparative example 1 is manufactured by a low process.

However, because the manner in which the elements in front of the points P1, p2, P3 change differently with respect to the semiconductor apparatus SYS using the delay circuit DL manufactured by the low process, the inconsistency of delay amount of the comparative example 1 is larger than that of the semiconductor apparatus SYS.

For example, the delay amounts between the points P1, P2, and P3 of the comparative example 1 in a case of the PTV condition 2 are 1.3 ns, 1.5 ns, and 1.6 ns, respectively. That is, the maximum skew between any of the points P1, P2, P3 is 300 ps. Thus, the maximum skew increases compared to the case where the delay circuit DL is manufactured by the low process. Further, for example, the delay amounts between the points P1, P2, and P3 of the comparative example 2 in a case of the PTV condition 2 are 1.8 ns, 2.0 ns, and 2.5 ns, respectively. That is, the maximum skew between any of the points P1, P2, P3 is 700 ps. Thus, the maximum skew increases compared to the case where the delay circuit DL is manufactured by the low process.

Hence, by manufacturing the second chip 20 including, for example, the delay control circuit DLC, the delay circuit DL with the low process according to the above-described embodiment of the present invention, the deviance of the relative timing of clock signals at each of the points P1, P2, P3 can be reduced. Further, the amount of power consumption by the second chip 20 can be reduced by using only circuits (e.g., delay control circuit DLC, delay circuit DL) required for clock distribution as the dynamic circuits constituting the second chip 20 according to the above-described embodiment of the present invention. Further, leakage current of the second chip 20 can be reduced by manufacturing the second chip 20 with the low process according to the above-described embodiment of the present invention.

With the first chip 10, the degree of integration can be improved because a miniaturizing process can be used on the first chip 10. Further, according to the above-described embodiment, there is no need to form a basic clock wiring in the first chip 10 because a basic clock wiring can be formed in the second chip 20. Therefore, according to the above-described embodiment, sufficient wiring resources can be used in the first chip 10, and thus, the functions of the first chip 10 can be improved. For example, high quality wiring layers (wiring layers having a small amount of parasitic resistance and parasitic capacitance), which are used for basic clock wirings, can be used as wirings of a data system. Thereby, the frequency of the data system can be improved.

In the above-described embodiment of the present invention, the semiconductor apparatus SYS includes the first and second chips 10, 20 that are connected by using a three-dimensional mounting method (e.g., TSV). Thereby, each of the first and the second chips 10, 20 can be manufactured with an optimum process that matches its intended purpose. That is, according to the above-described embodiment, two elements having opposite characteristics can coexist on a single semiconductor apparatus SYS by using the three-dimensional mounting method. For example, the first chip 20 on which a logic circuit LG is formed for achieving a function of the semiconductor apparatus SYS can be manufactured by the advanced process. Further, the second chip 20 on which the delay control circuit DLC and the delay circuit DL for distributing a clock signal to the logic circuit LG can be manufactured by the low process.

For example, a group of circuits including the delay control circuit DLC and the delay circuit DL can add a delay amount based on the cycle of the reference clock signal CKRF to a clock signal input to the delay circuit DL. Then, the clock signal can be distributed via the delay circuit DL. Accordingly, the delay amount of the clock signal maintains a delay amount near a predetermined amount (e.g., an amount equivalent to one cycle of the reference clock signal CKRF) even in a case where the PTV condition changes. Because the chip 20 is manufactured by using a processing having little manufacture inconsistency among its elements, the inconsistency of characteristics amount the delay circuits (elements) DL can be reduced. As a result, the deviation of the relative timing of clock signals can be reduced. Accordingly, with the above-described embodiment, the phases of the clock signals of the ports PT1 and PT2 can be matched. Hence, a synchronizing relationship of clock signals can be maintained at the ports PT1 and PT2 with the above-described embodiment.

Figure 11:
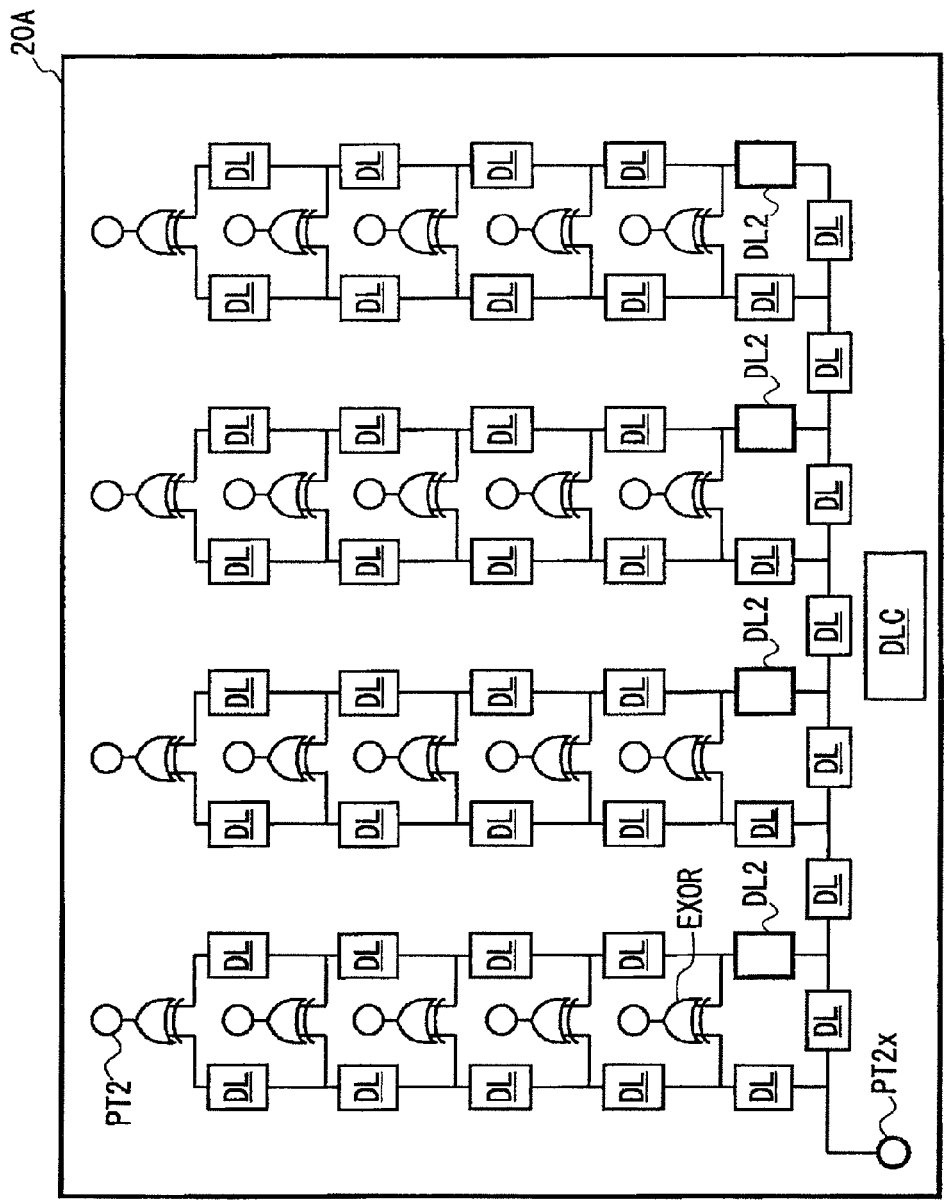
FIG. 11 is a schematic diagram illustrating an example of a second chip according to another embodiment of the present invention.

FIG. 11 is a schematic diagram illustrating an example of a second chip 20A according to another embodiment of the present invention. Through the drawings of the below-described other embodiments of the present invention, like components are denoted with like reference numerals as those of the above-described embodiment and are not further explained. The second chip 20A is configured having multiple exclusive-OR circuits EXOR added to the second chip 20 of FIG. 2. Further, compared to the second chip 20 of FIG. 2, a portion of delay circuits 20 are replaced with delay circuits 20A. Further, the output of the exclusive- or circuits EXOR is connected to the port PT2. Further, in FIG. 11, a first clock signal is received at a port PT2x positioned at the corner of the second chip 20A (i.e. bottom left corner in FIG. 11). The configuration of the second chip 20A is substantially the same as that of the second chip 20 except for the aforementioned differences.

For easier understanding of FIG. 11, wirings other than wirings used for transferring clock signals are omitted from FIG. 11. For easier understanding of FIG. 11, external terminals (e.g., pads on the chip) other than port PT2 are omitted from FIG. 11.

The delay circuit DL adds a delay equivalent to one cycle (360 degrees) of the reference clock CKRF to an input clock signal. In contrast, a delay circuit DL2 adds a delay equivalent to approximately a quarter cycle (approximately 90 degrees) to an input clock signal. The configuration of the delay circuit DL2 is substantially the same as the delay circuit DL except for the logic of the control part CLT illustrated in FIG. 8. For example, the control part CLT of the delay circuit DL2 generates a control signal SIG (SIG0 to SIG63) to become closer to a quarter of the delay amount indicated in the delay clock signal DCNT 1.

That is, the control part CLT of the delay circuit DL2 applies the value of the quarter of the delay amount indicated in the delay control signal DCNT2 in a case where the delay control signal DCNT2 is asserted. The operation of the control part CLT of the delay circuit DL2 is substantially the same as the operation of the control part CLT of the delay circuit DL in a case where the delay control signal DCNT2 is negated. For example, during the period where the delay control signal DCNT2 is negated, the control part CLT of the delay circuit DL2 maintains (does not change) the value of the control signal SIG.

For example, in a case where the delay path of the delay circuit DL is a delay path returning (folding back) at the delay circuit unit DLU62 (i.e. delay path illustrated with a broken line arrow in FIG. 8), the control part CLT of the delay circuit DL2 sets the control signal SIG15 to a high level and the control signals SIG0 to SIG14 to a low level. It is to be noted that the control signals SIG16 to SIG63 may be set to a low level or a high level. Accordingly, the delay path of the delay circuit DL2 is set as a delay path that returns at the delay control unit DLU15. As a result, the delay amount of the delay circuit DL2 is set to approximately a quarter of the delay amount of the delay circuit DL. Alternatively, a delay path that returns at a delay control unit DLU preceding the delay control unit DLU 15 may be selected as the delay path in view of the fixed delay amount of the inverters INV1 to INV4 and the delay circuit unit DUM2.

A clock path at which a clock signal is delayed for a period equivalent to one cycle of the first clock signal may also be hereinafter referred to as a 360° delayed clock path. Further, a clock path at which a clock signal is delayed for a period equivalent to approximately a quarter cycle of the first clock signal may also be hereinafter referred to as a 90° delayed clock path. The 360° delayed clock path may be formed by, for example, connecting delay circuits in multiple stages (multi-stage connection). The 90° delayed clock path may be formed by, for example, connecting the input of a first delay circuit DL of the multi-stage connected delay circuits DL to the output of the delay circuit DL2. In the example illustrated in FIG. 11, the delay circuits DL2 are arranged, so that the 360° delayed clock path and the 90° delayed clock path are formed alternately with each other.

Figure 12:
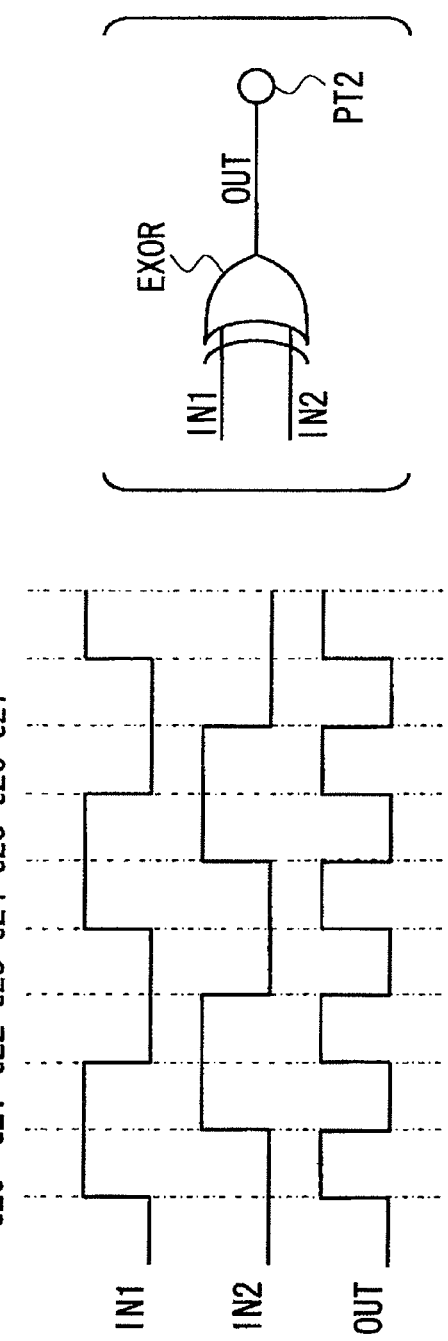
FIG. 12 is a schematic diagram illustrating an example of input and output clock signals of the exclusive OR circuit of FIG. 11.

The exclusive OR circuit EXOR receives two clock signals having two different delay amounts and outputs an exclusive logical sum (EXOR) of the two clock signals to the port PT2. For example, one of the inputs of the exclusive OR circuit EXOR is connected to the 360° delayed clock path, the other of the inputs of the exclusive OR circuit EXOR is connected to the 90° delayed clock path, and the output of the exclusive OR circuit EXOR is connected to the port PT2. In this case, the exclusive OR circuit EXOR outputs a clock signal having a frequency that is, for example, two times greater than that of the first clock signal as illustrated in FIG. 12. Accordingly, a clock signal faster than the first clock signal is transferred to the port PT2.

FIG. 12 illustrates an example of input and output clock signals of the exclusive OR circuit of FIG. 11. In FIG. 12, input clock IN1 indicates a clock signal input to the exclusive OR circuit EXOR from the 360° delayed clock path, and input clock IN2 indicates a clock signal input to the exclusive OR circuit EXOR from the 90°. The output clock OUT indicates a clock signal output from the exclusive OR circuit EXOR to the port PT2.

The exclusive OR circuit EXOR outputs a high level signal in a case where the logic (high level, low level) of the input clock signal IN1 and the logic (high level, low level) of the input clock signal IN2 are different. That is, the output clock signal OUT is a high level when the level of the input clock signal IN1 and the level of the input clock signal IN2 are different whereas the output clock signal OUT is a low level when the level of the input clock signal IN1 and the level of the input clock signal IN2 are the same.

For example, the input clock signal IN1 changes from low level to high level at time t20 of FIG. 12. Then, the input clock signal IN2 changes from low level to high level at time t21 (i.e. approximately a quarter cycle of the input clock signal IN1 subsequent to time t20). Therefore, because the level of the input clock signal IN1 and the level of the input clock signal IN2 are different during a period from time t20 to time t21, the output clock signal OUT is maintained at a high level.

Further, at time t22 (i.e. approximately a quarter cycle of the input clock signal IN1 subsequent to time t21), the input clock signal IN1 changes from high level to low level whereas the input clock signal IN2 is maintained at a high level. Therefore, because the level of the input clock signal IN1 and the level of the input clock signal IN2 are the same during the period from time t21 to time t22, the output clock signal OUT is maintained at a low level.

At time t23 (i.e. approximately a quarter cycle of the input clock signal IN1 subsequent to time 22), the input clock signal IN1 is maintained at a low level whereas the input clock signal IN2 changes from high level to low level. Therefore, because the level of the input clock signal IN1 and the level of the input clock signal IN2 are different during a period from time t22 to time t23, the output clock signal OUT is maintained at a high level.

Accordingly, the exclusive OR circuit EXOR outputs a clock signal OUT having a frequency that is twice the frequency of that of the input clock signals IN1, IN2. Thereby, a clock signal OUT having twice the frequency of the input clock signals (first clock signal) IN1, IN2 is transferred to the port PT2. That is, in this embodiment, the frequencies of the input clock signals IN1, IN2, which are handled by the delay control circuit DLC and the delay circuits DL, DL2, can be reduced compared to the frequency of the output clock signal OUT transferred to the first chip 10. That is, in this embodiment, even in a case where the second chip 20 is manufactured by the low process, a high speed clock signal can be distributed to the first chip 10.

The configuration of the second chip 20 is not limited to the configuration described above. For example, the clock path, which travels through the delay circuits DL, DL2, may be a unicursal path. In this case, the 90° delayed clock path and the 360° delayed clock path may be connected via a delay path which adds, for example, a delay of approximately three quarters of the reference clock signal CKRF to the input clock signal.

Alternatively, an exclusive OR circuit EXOR and a port PT2 may be provided on both sides of the 90° delayed clock path. In this case, the number of ports PT2 capable of transferring high speed clock signals can be increased without having to increase the number of delay circuits DL, DL2. Further, the clock path may be set by using a decoder or the like. Further, the clock path may be fixed by the wiring (layout) at the time of designing.

Hence, the same effects as those of the above-described embodiments can be attained by this embodiment. Further, in this embodiment, there is provided a delay circuit DL2 that generates a clock signal IN2 having a phase different from that of the delay circuit DL and an exclusive OR circuit EXOR that generates a high speed clock signal. For example, the exclusive OR circuit EXOR receives multiphase input clock signals IN1, IN2 and outputs high speed clock signals OUT that are faster than the input clock signals IN1, IN2 (e.g., clock signals having frequencies that are twice those of the input clock signals IN1, IN2). That is, in this embodiment, the frequencies of the input clock signals IN1, IN2 handled by the delay control circuit DLC and the delay circuits DL1, DL2 can be reduced to frequencies that are lower than those of the output clock signals OUT transferred to the first chip 10. As a result, in this embodiment, high speed clock signals can be distributed to the first chip 10 even in a case where the second chip 20 is manufactured by a low process.

Figure 13:
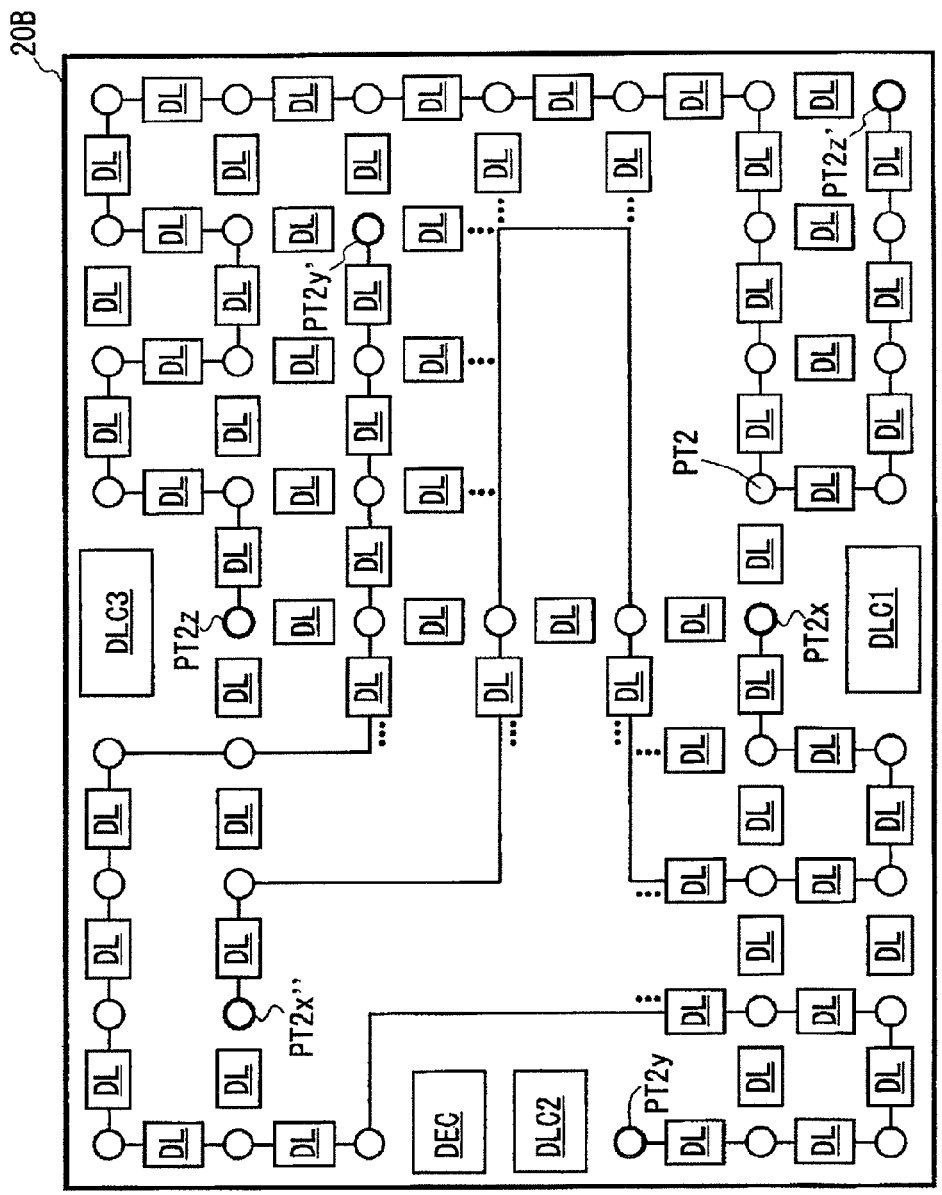
FIG. 13 is a schematic diagram illustrating an example of a second chip according to another embodiment of the present invention.

FIG. 13 is a schematic diagram illustrating an example of the second chip 20B according to another embodiment of the present invention. Through the drawings of the below-described other embodiments of the present invention, like components are denoted with like reference numerals as those of the above-described embodiment and are not further explained. The second chip 20B is configured having a decoder DEC added to the second chip 20 of FIG. 2. Further, compared to the second chip 20 of FIG. 2, the second chip 20B includes multiple delay control circuits DLC (in this embodiment, DLC1, DLC2, and DLC3). Further, in the second chip 20B, different systems of first clocks are received at, for example, the ports PT2$x$, PT2$y$, and PT2$z$. The configuration of the second chip 20B is substantially the same as that of the second chip 20 except for the aforementioned differences.

For easier understanding of FIG. 13, wirings other than wirings used for transferring clock signals are omitted from FIG. 13. For easier understanding of FIG. 13, external terminals (e.g., pads on the chip) other than port PT2 are omitted from FIG. 13. The ports PT2$x$, PT2$y$, PT2$z$, PT2$x'$, PT2$y'$, PT2$z'$ (indicated as circles illustrated in bold (thick lines) in FIG. 13) correspond to the starting point and the end point of the clock signals transferred in the second chip 20B.

First clock signals of different systems are transferred to the ports PT2$x$, PT2$y$, and PT2$z$, respectively. For example, in this embodiment, three phase lock loops (PLL) are formed, and signals (first clock signals) output from the three phase locked loops are transferred to each of the ports PT2$x$, PT2$y$, and PT2$z$.

The decoder DEC sets clock paths for each of the clock signals transferred to the ports PT2$x$, PT2$y$, and PT2$z$. In the example of FIG. 13, the first clock signal received by the port PT2$x$ is transferred to each port PT2 via a unicursal path (clock path) from the port PT2$x$ to the port PT2$x'$. Further, the first clock signal received by the port PT2$y$ is transferred to each port PT2 via a unicursal path (clock path) from the port PT2$y$ to the port PT2$y'$. Further, the first clock signal received by the port PT2$z$ is transferred to each port PT2 via a unicursal path (clock path) from the port PT2$z$ to the port PT2$z'$.

It is to be noted that the outputs of the delay circuits DL other than those provided on the clock path are set to a high impedance state. That is, the delay circuits DL are electrically connected, so that their outputs are prevented from colliding. In other words, the delay circuits DL are electrically connected for preventing clock signals output from multiple delay circuits DL from being transferred to a single port PT2. Then, the decoder DEC outputs data (signals) pertaining to the clock path to the delay circuits DL. The data pertaining to the clock path may include, for example, data pertaining to an origin of an input signal or a destination of an output signal (e.g., data corresponding to control signals ICNT, OCNT1, OCNT2 shown in FIG. 8) and data pertaining to the delay control circuit DLC which is to be the master of each delay circuit DL.

The delay control circuits DLC1, DLC2, and DLC3 receive reference clock signals CKRF corresponding to the systems of clock signals transferred from the ports PT2$x$, PT2$y$, and PT2$z$, respectively. For example, the reference signals CKRF received by the delay control circuits DLC1, DLC2, and DLC3 are different from each other. Further, the configuration of the delay control circuits DLC1, DLC2, DLC3 are substantially the same as the configuration of the delay control circuit DLC described with reference to FIGS. 1-10. With the configuration of the delay part DLP illustrated in FIG. 6, an inverting circuit (e.g., inverter INV41 of FIG. 9) capable of setting the output to a high impedance state is used as the inverter INV4.

Except for the function of the control part CLT, the configuration of the delay circuit DL is substantially the same as the configuration of the delay circuit DL described with reference to FIGS. 1-10. In this embodiment, the configuration of the clock path (delay path) from the terminal CPN1 to the terminal CPN2 is the same as the delay part DLP and the delay circuit DL. With the configuration of the delay part DL illustrated in FIG. 8, an inverting circuit (e.g., inverter INV41 of FIG. 9) capable of setting the output to a high impedance state is used as the inverter INV4.

For example, the delay circuit DL receives delay control signals DCNT1, DCNT2 from all of the delay control circuits DLC1, DLC2, and DLC3. Then, the delay circuit DL selects a delay control signal DCNT1, DCNT2 to be used for setting the delay amount based on a path selected by the decoder DEC. For example, in a case of the delay circuit DL provided on the clock path for transferring the first clock signal received at the port PT2$x$, the control part CLT uses the delay control signals DCNT1, DCNT2 received from the delay control circuit DLC1. Further, in a case of the delay circuit DL provided on the clock path for transferring the first clock signal received at the port PT2$y$, the control part CLT uses the delay control signals DCNT1, DCNT2 received from the delay control circuit DLC2. Further, in a case of the delay circuit DL provided on the clock path for transferring the first clock signal received at the port PT2$z$, the control part CLT uses the delay control signals DCNT1, DCNT2 received from the delay control circuit DLC3.

The configuration of the second chip 20B is not limited to the configuration described above. For example, the number of delay control circuits DLC may be two, or four or more. Further, the clock paths do not need to be unicursal paths. For example, as long as the output of the delay circuit DL can be prevented from colliding with other outputs of the delay circuits DL, the inputs of multiple delay circuits DL may be electrically connected to the output of a single delay circuit DL. In this case, the choices of paths to which a clock path is set can be increased. This facilitates designing of clock paths. Further, the decoder DEC may be omitted. In this case, the delay control circuit DLC (which is to be the master of the clock path and each delay circuit DL) is fixed with the wiring (layout) during the designing of the clock signal.

Hence, the same effects as those of the above-described embodiments can be attained by this embodiment. Further, in this embodiment, clock signals of different systems can be distributed in the second chip 20B. That is, in this embodiment, multiple clock networks can be formed in the second chip 20B. Thereby, the chip 20B can be applied to the first chip 10 having multiple logic circuits operated by clock signals of different systems. Thus, in this embodiment, the second chip 20 can be used for more general purposes.

Figure 14:
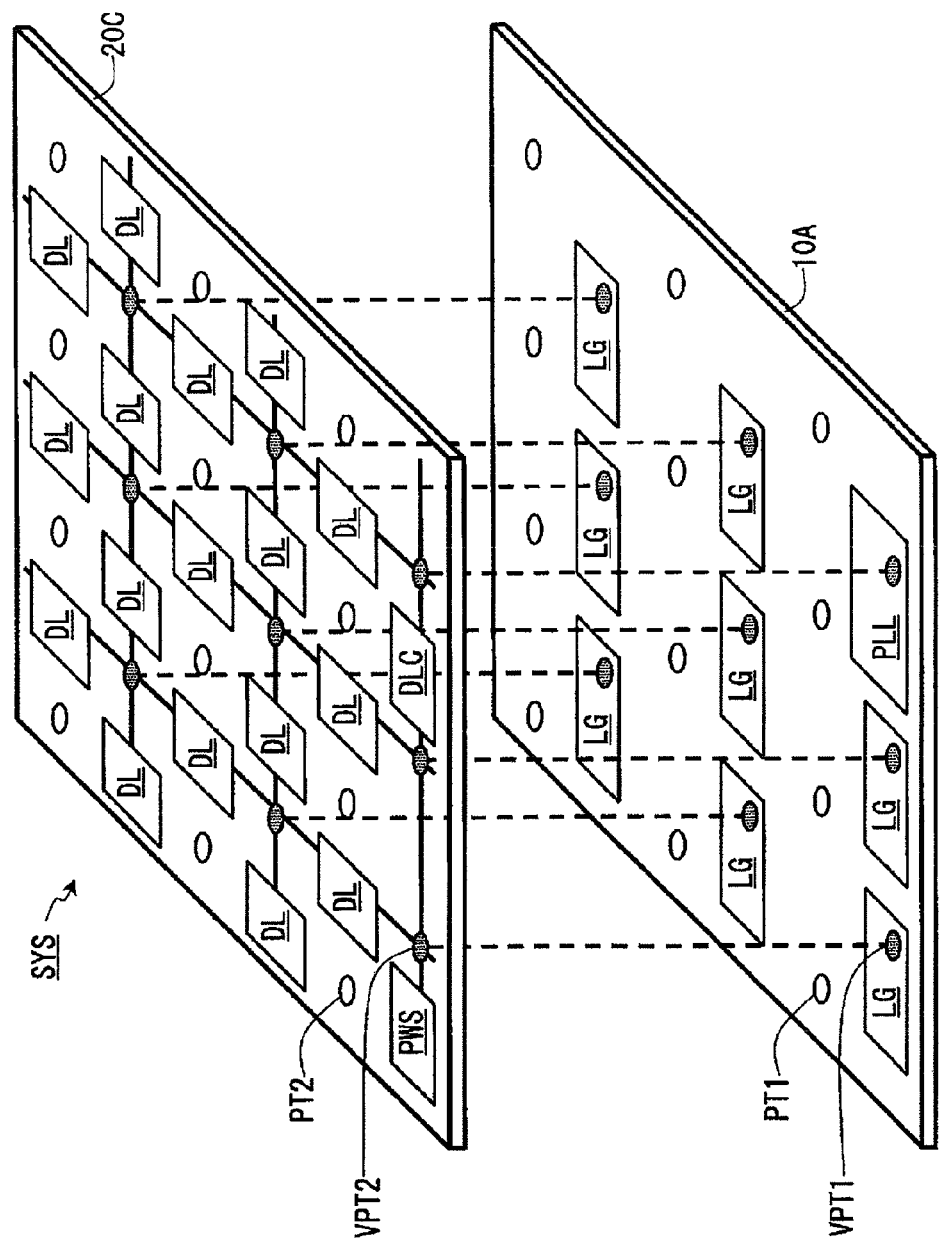
FIG. 14 is a schematic diagram illustrating an example of a semiconductor apparatus according to another embodiment of the present invention.

FIG. 14 is a schematic diagram illustrating an example of the semiconductor apparatus SYS according to another embodiment of the present invention. Through the drawings of the below-described other embodiment of the present invention, like components are denoted with like reference numerals as those of the above-described embodiments and are not further explained. In this embodiment, the semiconductor apparatus SYS includes a first chip 10A and a second chip 20C instead of the first and the second chips 10, 20 illustrated in FIG. 1. The configuration of the second chip 20C is substantially the same as the configuration of the second chip 20 except that the second chip 20C includes a power supply part PWS for supplying voltage of the power source (power supply) and a port VPT2. Further, the configuration of the first chip 10A is substantially the same as the configuration of the first chip 10 except that the first chip 10A includes a port VPT1 for receiving power supply voltage from the power supply part PWS by way of the port VPT2. The configuration of the semiconductor apparatus SYS is substantially the same as that of the semiconductor apparatus SYS except for the aforementioned differences.

For easier understanding of FIG. 14, wirings other than a portion of the power source wirings of the second chip 20C are omitted from FIG. 14. For easier understanding of FIG. 14, external terminals (e.g., pads on the chip) other than the ports PT1, PT2, VPT1, VPT2 are omitted from FIG. 14.

The first chip 10A includes, for example, a phase locked loop PLL, a logic circuit LG, a port PT1, and a port VPT1. The second chip 20C includes, for example, a delay control circuit DLC, a delay circuit DL, a power supply part PWS, a port PT2, and a port VPT2.

The power supply part PWS may be, for example, a DC-DC converter that generates a desired power supply voltage (power source). The power supply voltage generated by the power supply part PWS is supplied to the port VPT1 of the first chip 10A by way of the port VPT2. The port VPT2 may include, for example, a through-electrode penetrating the second chip 20C. Thus, the port VPT2 and the port VPT1 may be connected via the through-electrode. Alternatively, the port VPT2 and the port VPT1 may be connected by a bump in a case where the port PT1 and the port PT2 are connected by having a bump formed therebetween.

In the first chip 10A, the logic circuit LG receives the power supply voltage from the port VPT1. That is, the power supply part PWS of the second chip 20C supplies a power supply voltage to the logic circuit LG of the first chip 10A by way of the port VPT2 and the port VPT1. Therefore, in this embodiment, there is no need to form an internal power supply (power source) or a power source ring in the first chip 10A. Thereby, the logic area of the first chip 10A can be increased (expansion of logic area). As a result, the degree of integration of the first chip 10A can be improved.

The configuration of the semiconductor apparatus SYS is not limited to the configuration described above. For example, the power supply part PWS and the port VPT2 may be formed on the second chip 20A described above with reference to FIG. 11 or on the second chip 20B described above with reference to FIG. 13. In these cases, the port VPT1 is formed on the first chip 10 that corresponds to the second chip 20A or 20B.

Hence, the same effects as those of the above-described embodiments can be attained by this embodiment. Further, in this embodiment, power supply voltage of the logic circuit LG of the first chip 10A is supplied from the power supply part PWS of the second chip 20C by way of the ports VPT2 and VPT1. Thus, with this embodiment, the first chip 10A can have a large logic area because no internal power source I/O or power source ring is need to be formed. Accordingly, with this embodiment, the degree of integration of the first chip 10A can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
   a first chip including
      a plurality of first ports configured to receive a clock signal, and
      a plurality of first circuits configured to operate in synchronization with the clock signal, wherein each one of the plurality of first ports is connected to each one of the plurality of first circuits; and
   a second chip mounted on the first chip;
   wherein the second chip includes
      a delay control part configured to generate a delay control signal indicating a delay amount based on a cycle of a reference clock signal,
      a plurality of delay circuits connected in multiple stages and configured to add a delay to an input clock signal based on the delay control signal and sequentially output a delayed clock signal to a subsequent stage, and
      a plurality of second ports, wherein each one of the plurality of second ports is connected to an output of each one of the plurality of delay circuits and connected to each one of the plurality of first ports.

2. The semiconductor apparatus as claimed in claim 1, wherein each one of the plurality of second ports is connected to each one of the plurality of first ports by way of a through-electrode penetrating the second chip.

3. The semiconductor apparatus as claimed in claim 1,
   wherein the plurality of first ports are formed on a surface of the first chip facing the second chip,
   wherein the plurality of second ports are formed on a surface of the second chip facing the first chip,
   wherein the plurality of first ports and the plurality of second ports are connected by way of a plurality of bumps.

4. The semiconductor apparatus as claimed in claim 1,
   wherein the plurality of delay circuits are arranged in a mesh-like manner,
   wherein each one of the plurality of second ports is connected to the output of each one of the plurality of delay circuits connected in multiple stages.

5. The semiconductor apparatus as claimed in claim 1,
   wherein a difference of characteristic change between elements of the second chip in correspondence with temperature change or power supply change is less than a difference of characteristic change between elements of the first chip in correspondence with temperature change or power supply change.

6. A semiconductor apparatus comprising:
a first chip including
- a first port configured to receive an operation clock signal, and
- a first circuit configured to operate in synchronization with the operation clock signal; and a second chip mounted on the first chip;
wherein the second chip includes
- a delay control part configured to generate a delay control signal indicating a delay amount based on a cycle of a reference clock signal,
- a plurality of delay circuits connected in multiple stages and configured to delay clock signals input to a plurality of delay control circuits based on the delay control signal and sequentially output the delayed clock signals to a subsequent stage, and
- a second port connected to the first port and configured to receive the operation clock signal based on the delayed clock signals output from the plural delay circuits, wherein the second chip further includes an exclusive OR circuit configured to receive two clock signals having different delay amounts and output an exclusive logical sum of the two clock signals to the second port, wherein one portion of the plural delay circuits are configured to add a delay amount different from a delay amount of another portion of the plural delay circuits to an input clock signal and generate one of the two clock signals, wherein the exclusive OR circuit includes one input connected to an output of one of the plural delay circuits configured to receive one of the two clock signals and another input connected to an output of another one of the plural delay circuits configured to receive the other of the two clock signals.

7. A semiconductor apparatus comprising:
a first chip including
- a first port configured to receive an operation clock signal, and
- a first circuit configured to operate in synchronization with the operation clock signal; and a second chip mounted on the first chip;
wherein the second chip includes
- a delay control part configured to generate a delay control signal indicating a delay amount based on a cycle of a reference clock signal,
- a plurality of delay circuits connected in multiple stages and configured to delay clock signals input to a plurality of delay control circuits based on the delay control signal and sequentially output the delayed clock signals to a subsequent stage, and
- a second port connected to the first port and configured to receive the operation clock signal based on the delayed clock signals output from the plural delay circuits, wherein the first chip further includes a first power supply port,
wherein the second chip further includes
- a second power supply port to which a power voltage is supplied, and
- a power supply part configured to supply the power voltage to the second power supply port, wherein the first power supply port is connected to the second power supply port and configured to receive the power voltage from the power supply part by way of the second power supply port.

* * * * *